(12) United States Patent
Matsumoto et al.

(10) Patent No.: US 7,393,731 B2
(45) Date of Patent: Jul. 1, 2008

(54) SEMICONDUCTOR DEVICE AND METHOD OF MANUFACTURING THE SAME

(75) Inventors: Takuji Matsumoto, Tokyo (JP); Toshiaki Iwamatsu, Tokyo (JP); Yuuichi Hirano, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 253 days.

(21) Appl. No.: 11/156,554

(22) Filed: Jun. 21, 2005

(65) Prior Publication Data

US 2005/0253219 A1 Nov. 17, 2005

Related U.S. Application Data

(62) Division of application No. 09/729,816, filed on Dec. 6, 2000, now Pat. No. 6,933,565.

(30) Foreign Application Priority Data

Jun. 8, 2000 (JP) ............................. P2000-171818

(51) Int. Cl.
*H01L 21/00* (2006.01)
*H01L 21/84* (2006.01)

(52) U.S. Cl. .................. 438/154; 438/311; 438/322; 438/353; 438/359; 438/778; 438/761; 438/763; 257/E21.267; 257/E21.293; 257/E21.564; 257/E21.703

(58) Field of Classification Search ................ 438/154, 438/311, 322, 353, 359, 778, 761, 763; 257/E21.267, 257/E21.293, E21.564, E21.703
See application file for complete search history.

(56) References Cited

U.S. PATENT DOCUMENTS

| 5,726,499 A | 3/1998 | Irinoda |
| 5,767,549 A | 6/1998 | Chen et al. |
| 5,899,712 A | 5/1999 | Choi et al. |
| 6,060,784 A | 5/2000 | Oda |
| 6,080,655 A | 6/2000 | Givens et al. |
| 6,083,822 A | 7/2000 | Lee |
| 6,191,445 B1 * | 2/2001 | Fujiwara ..................... 257/321 |

(Continued)

FOREIGN PATENT DOCUMENTS

JP 56-150853 11/1981

(Continued)

OTHER PUBLICATIONS

Y. Hirano, et al., "Bulk-Layout-Compatible 0.18μm SOI-CMOS Technology Using Body-Fixed Partial Trench Isolation (PTI)" 1999 IEEE, International SOI Conference, Oct. 1999, (pp. 131-132, 19-25).

(Continued)

*Primary Examiner*—Fernando L. Toledo
*Assistant Examiner*—Jarrett J Stark
(74) *Attorney, Agent, or Firm*—Oblon, Spivak, McClelland, Maier & Neustadt, P.C.

(57) ABSTRACT

A silicon nitride film is formed between interlayer insulating films covering an upper surface of an element formed on a surface of a semiconductor layer. With this structure, a semiconductor device comprising an isolation insulating film of PTI structure, which suppresses a floating-body effect and improves isolation performance and breakdown voltage, and a method of manufacturing the semiconductor device can be obtained.

9 Claims, 14 Drawing Sheets

U.S. PATENT DOCUMENTS

| | | |
|---|---|---|
| 6,211,569 B1 | 4/2001 | Lou |
| 6,261,949 B1 | 7/2001 | Sukekawa |
| 6,300,683 B1 * | 10/2001 | Nagasaka et al. ........... 257/774 |
| 6,320,234 B1 | 11/2001 | Karasawa et al. |
| 6,362,508 B1 | 3/2002 | Rasovsky et al. |

FOREIGN PATENT DOCUMENTS

| | | |
|---|---|---|
| JP | 58-56450 | 4/1983 |
| JP | 58-124243 | 7/1983 |
| JP | 5-95116 | 4/1993 |
| JP | 6-244180 | 9/1994 |
| JP | 6-21373 | 12/1994 |
| JP | 9-69610 | 3/1997 |
| JP | 10-32266 | 2/1998 |
| JP | 11-87723 | 3/1999 |
| WO | WO 97/18585 | 5/1997 |
| WO | WO 99/33115 | 7/1999 |

OTHER PUBLICATIONS

T. Matsumoto et al., "Clarification of Floating-Body Effects on Current Drivability in Deep Sub-Quarter Micron Partially-Depleted SOI MOSFET's" Extended Abstracts of the 1999 International Conference on Solid State Devices and Material, Tokyo, 1999., (pp. 340-341).

* cited by examiner

SEMICONDUCTOR DEVICE AND METHOD OF MANUFACTURING THE SAME

BACKGROUND OF THE INVENTION

1. Field of the Invention

The present invention relates to a semiconductor device having an SOI (Silicon On Insulator) structure and a method of manufacturing the same, and more particularly to a semiconductor device having an isolation insulating film (hereinafter, referred to as a PTI (Partial Trench Isolation) which does not reach a buried oxide film and a method of manufacturing the same.

2. Description of the Background Art

A semiconductor device having an SOI (Silicon On Insulator) structure consisting of a semiconductor substrate, a buried oxide film and a semiconductor layer has no possibility of causing a latch up even if a CMOS transistor is formed since an active region is surrounded by the buried oxide film and a device isolation (hereinafter, referred to as an FTI (Full Trench Isolation) which reach the buried oxide film). Further, the semiconductor device of SOI structure, in which a transistor is formed on the thin semiconductor layer, has a smaller junction capacitance and allows a faster operation with lower power consumption as compared with a semiconductor device in which a transistor is formed directly on a surface of the semiconductor substrate. Therefore, it is recently expected that the semiconductor device of SOI structure should be applied to an LSI for portable device.

Unlike a transistor formed directly on the semiconductor substrate, however, the semiconductor device of SOI structure in the background art has various problems caused by the floating-body effect since the semiconductor layer is electrically isolated from the semiconductor substrate by the buried oxide film. For example, a kink in operation characteristics is caused and the drain breakdown voltage is deteriorated by carriers (positive hole in an NMOS and electrons in a pMOS) which are generated through impact ionization phenomenon in the active region and accumulated inside the semiconductor layer in a lower portion of a channel formation region, and frequency dependency of delay time is caused by instability of a potential in a channel region. To solve these problems, it is effective to fix the potential in the channel formation region. Japanese Patent Application Laid Open Gazette No. 58-124243 discloses a semiconductor device in which the potential is fixed in the channel formation region.

Recently, in order to collectively fix the potentials in the channel formation regions of a plurality of transistors of the same conductivity type, instead of fixing the potential in the channel formation region of each transistor, an isolation is performed by using the PTI for downsizing, and such a structure is disclosed in IEEE International SOI Conference, October 1999 pp. 131 to 132, and the like.

FIG. 22 is a cross section showing a semiconductor device in the background art. The semiconductor device of FIG. 22 comprises a semiconductor substrate 101, a buried oxide film 102, a p-type semiconductor layer 103, an isolation oxide film 104, a gate insulating film 105, a gate electrode 106, n-type source/drain regions 107 and 108, a sidewall insulating film 109, a wire 1010, an interlayer insulating film 1011, a p-type impurity region 1012 and a contact hole 1013. Further, the p-type semiconductor layer 103 below the isolation oxide film 104 is particularly represented as 103a. As shown in FIG. 22, in the case of a PTI, the isolation insulating films 104 between adjacent two transistors and between the p-type impurity region 1012 and the transistor do not reach the buried oxide film 102 and channel formation regions of the two transistors are connected to the p-type impurity region 1012 through the p-type semiconductor layer 103a and the wire 1010 to fix potentials of the channel formation regions in a plurality of transistors of the same conductivity type is connected to the p-type impurity region 1012. The p-type impurity region 1012 has a low resistance, containing an impurity which has a concentration higher than that of the p-type semiconductor layer 103.

Further, for downsizing, the wire 1010 is so formed as to extend onto over a surface of the isolation oxide film 104 (hereinafter, such a structure will be referred to as "borderless contact structure"), to improve the element density.

FIG. 23 is a cross section showing another semiconductor device in the background art. Referring to FIG. 23, the wires 1010 connected to the source/drain regions 107 and 108 are so formed as to extend onto over the surface of the isolation oxide film 104.

Even a semiconductor device having the isolation insulating film of PTI structure to fix the potential of the channel formation region, however, has a problem of causing the floating-body effect since the semiconductor layer below the PTI is thin (up to 50 nm). When the semiconductor layer below the PTI is thin, the resistance between the wire and the transistor becomes higher as goes further away from the wire which fixes the potential of the channel formation region, to badly affect the characteristics of the transistor. Further, there arises a variation in resistance of the channel formation regions in the transistors depending on the distance from the wire which fixes the potential of the channel formation region, which disadvantageously causes a variation in element characteristics.

Furthermore, when it is intended that the element density should be improved by using the borderless contact structure, there is possibility that the isolation oxide film 104 should be also etched when the contact hole 1013 is formed in the interlayer insulating film 1011 since the isolation oxide film 104 and the interlayer insulating film 1011 consisting of a TEOS (tetraethyl orthosilicate) oxide film and the like are of the same quality.

FIG. 24 is a cross section showing a semiconductor device in the background art. As shown in FIG. 24, when the isolation oxide film 104 is etched, the distance from a pn junction between the p-type semiconductor layer 103a below the isolation oxide film 104 and the source region or drain region 107 or 108 to the wire 1010 becomes shorter, to cause an increase in junction leak current.

SUMMARY OF THE INVENTION

The present invention is directed to a semiconductor device. According to a first aspect of the present invention, the semiconductor device comprises: an SOI substrate consisting of a substrate in which at least its surface is insulative and a semiconductor layer provided on the surface of the substrate, the semiconductor layer has a first active region of a first conductivity type and a second active region of the first conductivity type both of which are provided in a main surface thereof, an isolation insulating film formed between the first and second active regions in the main surface of the semiconductor layer, leaving a first semiconductor region which is part of the semiconductor layer between itself and the surface of the substrate; a first interlayer insulating film formed on the first and second active regions and a surface of the isolation insulating film; a silicon nitride film formed on the first interlayer insulating film; and a second interlayer insulating film formed on a surface of the silicon nitride film.

According to a second aspect of the present invention, in the semiconductor device of the first aspect, the substrate includes a semiconductor substrate and a buried insulating film entirely provided on a main surface of the semiconductor substrate, and the semiconductor device further comprises: first source region and drain region of a second conductivity type formed in the main surface of the semiconductor layer of the first active region at a predetermined distance; a first gate electrode so formed on the main surface of the semiconductor layer with a first gate insulating film interposed therebetween as to oppose to a region sandwiched between the first source region and drain region; a first impurity region of the first conductivity type formed in the second active region, being electrically connected to the region sandwiched between the first source region and drain region through the first semiconductor region below the isolation insulating film; and a first wire, a second wire and a third wire connected to the first source region and drain region and the first impurity region through contact holes which are so formed as to penetrate the first and second interlayer insulating films and the silicon nitride film, respectively.

According to a third aspect of the present invention, in the semiconductor device of the second aspect, the semiconductor layer further has a third active region of the second conductivity type and a fourth active region of the second conductivity type both of which are provided in the main surface thereof, and the isolation insulating film is further provided between the third and fourth active regions and between the first and fourth active regions, the isolation insulating film provided between the third and fourth active regions is formed in the main surface of the semiconductor layer, leaving a second semiconductor region which is part of the semiconductor layer between itself and the buried insulating film, and the isolation insulating film provided between the first and fourth active regions is formed in the main surface of the semiconductor layer, leaving a third semiconductor region which is part of the semiconductor layer between itself and the buried insulating film, and the semiconductor device further comprises: second source region and drain region of the first conductivity type formed in the main surface of the semiconductor layer of the fourth active region at a predetermined distance; a second gate electrode so formed on the main surface of the semiconductor layer with a second gate insulating film interposed therebetween as to oppose to a region sandwiched between the second source region and drain region; and a second impurity region of the second conductivity type formed in the main surface of the semiconductor layer of the third active region, being electrically connected to the region sandwiched between the second source region and drain region through the second semiconductor region below the isolation insulating film, wherein the first interlayer insulating film, the silicon nitride film and the second interlayer insulating film extend onto the main surface of the semiconductor layer in the third and fourth active regions, and the semiconductor device further comprises: a fourth wire, a fifth wire and a sixth wire connected to the second source region and drain region and the second impurity region through the contact holes which are formed in the first and second interlayer insulating films and the silicon nitride film, respectively.

According to a fourth aspect of the present invention, in the semiconductor device of the second aspect, the semiconductor layer further has a third active region of the second conductivity type and a fourth active region of the second conductivity type both of which are provided in the main surface thereof, and the isolation insulating film is further provided between the third and fourth active regions and between the first and fourth active regions, the isolation insulating film provided between the third and fourth active regions is formed in the main surface of the semiconductor layer, leaving a second semiconductor region which is part of the semiconductor layer between itself and the buried insulating film, and the isolation insulating film provided between the first and fourth active regions is so formed as to reach the buried insulating film, and the semiconductor device further comprises: second source region and drain region of the first conductivity type formed in the main surface of the semiconductor layer of the fourth active region at a predetermined distance; a second gate electrode so formed on the main surface of the semiconductor layer with a second gate insulating film interposed therebetween as to oppose to a region sandwiched between the second source region and drain region; and a second impurity region of the second conductivity type formed in the main surface of the semiconductor layer of the third active region, being electrically connected to the region sandwiched between the second source region and drain region through the second semiconductor region below the isolation insulating film, wherein the first interlayer insulating film, the silicon nitride film and the second interlayer insulating film extend onto the main surface of the semiconductor layer in the third and fourth active regions, and the semiconductor device further comprises: wires connected to the second source region and drain region and the second impurity region through the contact holes which are formed in the first and second interlayer insulating films and the silicon nitride film, respectively.

According to a fifth aspect of the present invention, in the semiconductor device of the second aspect, the first and second wires connected to the source region and drain region include wires extending to the surfaces of the isolation insulating films adjacent to the first source region and drain region, respectively.

According to a sixth aspect of the present invention, in the semiconductor device of the fifth aspect, the first semiconductor region below the isolation insulating film has partial impurity regions of the same conductivity type in respective regions adjacent to the first source region and drain region.

According to a seventh aspect of the present invention, in the semiconductor device of the first aspect, the silicon nitride film includes a silicon nitride film entirely formed.

According to an eighth aspect of the present invention, in the semiconductor device of the second aspect, further comprises: a metal silicide layer formed in surfaces of the source region and drain region.

The present invention is also directed to a method of manufacturing a semiconductor device. According to a ninth aspect of the present invention, the method of manufacturing a semiconductor device comprises the step of: (a) preparing an SOI substrate having a semiconductor layer which is formed with a substrate in which at least its surface is insulative disposed therebelow, the semiconductor layer has a first active region and a second active region both of a first conductivity type in a main surface thereof; (b) forming an isolation insulating film so as to surround the first and second active regions and leave a first semiconductor region which is part of the semiconductor layer therebelow; (f) forming a first interlayer insulating film on the semiconductor layer in the first and second active regions and a surface of the isolation insulating film; (g) forming a silicon nitride film on the first interlayer insulating film; and (h) forming a second interlayer insulating film on a surface of the silicon nitride film.

According to a tenth aspect of the present invention, in the method of manufacturing a semiconductor device of the ninth aspect, the substrate includes a semiconductor substrate and a buried oxide film, the method further comprises the steps of: (c) forming a first impurity region of the first conductivity type on a main surface of the semiconductor layer in the second active region; (d) forming a first gate electrode on the main surface of the semiconductor layer in the first active region with a first gate insulating film interposed therebetween; (e) forming first source region and drain region of a second conductivity type in the main surfaces of the semiconductor layer of the first active region which sandwich a region opposed to the first gate electrode at a predetermined distance; (i) forming contact holes which reach the first source region and drain region and the first impurity region in the first and second interlayer insulating films and the silicon nitride film, respectively; and (j) forming a first wire, a second wire, a third wire which are connected to the first source region and drain region and the first impurity region through the contact holes, respectively.

According to an eleventh aspect of the present invention, in the method of manufacturing a semiconductor device of the tenth aspect, the semiconductor layer further has a third active region of the second conductivity type and a fourth active region of the second conductivity type in its main surface, and the fourth source region is provided adjacently to the first active region and the third active region is provided adjacently to the fourth active region, the step (a) includes the steps of: (a-1) selectively introducing an impurity of the first conductivity type into the main surface of the semiconductor layer to obtain the first and second active regions; and (a-2) selectively introducing an impurity of the second conductivity type into the main surface of the semiconductor layer to obtain the third and fourth active regions, the step (b) includes the step of: forming the isolation insulating film so as to surround the third and fourth active regions and leave a second semiconductor region which is part of the semiconductor layer therebelow; the step (c) includes the step of: forming a second impurity region of the second conductivity type in the third active region, the step (d) includes the step of: forming a second gate electrode on a main surface of the fourth active region with a second gate insulating film interposed therebetween, the step (e) includes the step of: forming second source region and drain region of the first conductivity type in the main surfaces of the semiconductor layer of the fourth active region which sandwich a region opposed to the second gate electrode at a predetermined distance, the first interlayer insulating film, the silicon nitride film and the second interlayer insulating film formed in the steps (f) to (h) extend onto surfaces of the semiconductor layer in the third and fourth active regions, the step (i) includes the step of: forming contact holes which reach the second source region and drain region and the second impurity region in the first and second interlayer insulating films and the silicon nitride film, respectively, and the step (j) includes the step of: forming a fourth wire, a fifth wire, a sixth wire which are connected to the second source region and drain region and the second impurity region through the contact holes, respectively.

According to a twelfth aspect of the present invention, in the method of manufacturing a semiconductor device of the tenth aspect, the step (i) includes the steps of: (i-1) etching the second interlayer insulating film; and (i-2) etching the first interlayer insulating film independently of the step (i-1).

According to a thirteenth aspect of the present invention, in the method of manufacturing a semiconductor device of the twelfth aspect, the contact holes formed in the step (i) include contact holes which extend onto surfaces of the isolation insulating films adjacently to the first source region and drain region, respectively.

According to a fourteenth aspect of the present invention, in the method of manufacturing a semiconductor device of the twelfth aspect, the step (i-1) includes the step of: etching the second interlayer insulating film by a first substance having a predetermined selection ratio to the silicon nitride film, and the step (i-2) includes the step of: etching the first interlayer insulating film by a second substance having a selection ratio to the silicon nitride film which is smaller than that of the first substance.

Since the semiconductor device of the first aspect of the present invention comprises the silicon nitride film formed on a surface of an element with the first interlayer insulating film interposed therebetween, micro-defects which develop into lifetime killers are generated in the first semiconductor region which is the semiconductor layer below the isolation insulating film by a stress of the silicon nitride film and this shorten the lifetime of carriers (positive holes in an NMOS and electrons in a pMOS).

Therefore, even if the film thickness of the first semiconductor region below the isolation insulating film becomes thinner, a potential of the first active region can be stably fixed and a floating-body effect, such as the frequency dependency of delay time of an element to be formed in the first active region, e.g., a transistor, can be suppressed, whereby the reliability of the semiconductor device can be improved.

Since the semiconductor device of the second aspect of the present invention, in which an element is formed on the main surface of the SOI substrate consisting the semiconductor substrate, the buried insulating film provided entirely over the surface of the semiconductor substrate and the semiconductor layer provided on the surface of the buried insulating film, comprises the silicon nitride film formed on a surface of the element with the first interlayer insulating film interposed therebetween, micro-defects which develop into lifetime killers are generated in the first semiconductor region which is the semiconductor layer below the isolation insulating film by a stress of the silicon nitride film and this shorten the lifetime of carriers (positive hole in an nMOS and electrons in a pMOS).

Therefore, even if the film thickness of the first semiconductor region below the isolation insulating film becomes thinner, a potential of the channel formation region below the gate electrode can be stably fixed and a floating-body effect, such as the frequency dependency of delay time of the MOS transistor can be suppressed, whereby the reliability of the semiconductor device can be improved.

In the semiconductor device of the third aspect of the present invention, when the device has a CMOS structure in which transistors of reverse conductivity types are provided adjacently to each other with a PTI (the isolation insulating film and the third semiconductor region therebelow) interposed therebetween, the breakdown voltage increases between a pMOS transistor and an nMOS transistor which are adjacent to each other by micro-defects generated in the third semiconductor region below the isolation insulating film and therefore the reliability of the semiconductor device can be improved.

In the semiconductor device of the fourth aspect of the present invention, since an FTI (the isolation insulating film reaching the buried insulating film) is formed in a portion where the transistors of reverse conductivity types are provided adjacently to each other in the CMOS structure, the breakdown voltage increases between the adjacent pMOS transistor and nMOS transistor and therefore the reliability of the semiconductor device can be improved.

Since the semiconductor device of the fifth aspect of the present invention, which has a borderless contact structure in which the first and second wires connected to the first source/drain regions are formed across the adjacent isolation insulating films, comprises the silicon nitride film between the interlayer insulating films, the isolation insulating film is prevented from being etched when the contact holes reaching the first source/drain regions are formed and sufficient distances from the pn junctions between the first semiconductor region below the isolation insulating film and the first source/drain regions to the wires can be ensured, whereby a semiconductor device of higher element density and higher reliability can be obtained.

In the semiconductor device of the sixth aspect of the present invention, since the first semiconductor region below the isolation insulating film has the partial impurity region of the second conductivity type, which is equivalent to the first source/drain regions in conductivity type, adjacent to the first source/drain regions, the exposed isolation insulating film is likely to be etched when the contact holes of borderless contact structure are formed. In such a case, however, a sufficient distance between the wire and the region of the first conductivity type in the first semiconductor region below the isolation insulating film can be ensured and it becomes possible to eliminate the possibility of generating a junction leak current in this portion.

Since the semiconductor device of the seventh aspect of the present invention comprises the silicon nitride film, it is possible to surely prevent entry of hydrogen into the gate insulating film and the buried oxide film. Therefore, it is possible to prevent deterioration of the hot carrier resistance caused by the entry of hydrogen into the gate insulating film resulting in hydrogen termination at the interface between the semiconductor layer and the gate insulating film and improve the hot carrier resistance.

In the semiconductor device of the eighth aspect of the present invention, the metal silicide layer is formed on the surfaces of the first source region and drain region. Therefore, since the metal silicide layer works as an etching stopper when the first interlayer insulating film is etched, an etching margin is increased and the wires are formed with good controllability, whereby a semiconductor device of higher reliability can be obtained.

Since the semiconductor device manufactured by the method of the ninth aspect of the present invention comprises the silicon nitride film formed on an element with the first interlayer insulating film interposed therebetween, micro-defects which develop into lifetime killers are generated in the first semiconductor region which is the semiconductor layer below the isolation insulating film by a stress of the silicon nitride film and this shorten the lifetime of carriers (positive hole in an nMOS and electrons in a pMOS).

Therefore, even if the film thickness of the first semiconductor region below the isolation insulating film becomes thinner, a potential of the first active region can be stably fixed and a floating-body effect, such as the frequency dependency of delay time of an element to be formed in the first active region, e.g., a transistor, can be suppressed, whereby the reliability of the semiconductor device can be improved.

In the method of the tenth aspect of the present invention, the silicon nitride film is formed on a surface of an element with the first interlayer insulating film interposed therebetween in the semiconductor device in which the element is formed on the main surface of the SOI substrate consisting the semiconductor substrate, the buried insulating film provided entirely over the surface of the semiconductor substrate and the semiconductor layer provided on the surface of the buried insulating film, micro-defects which develop into lifetime killers are generated in the first semiconductor region which is the semiconductor layer below the isolation insulating film by a stress of the silicon nitride film and this shorten the lifetime of carriers (positive hole in an nMOS and electrons in a pMOS). Therefore, even if the film thickness of the first semiconductor region below the isolation insulating film becomes thinner, a potential of the channel formation region below the gate electrode can be stably fixed and a floating-body effect, such as the frequency dependency of delay time can be suppressed, whereby a semiconductor device of higher reliability can be manufactured.

In the method of the eleventh aspect of the present invention, since the silicon nitride film is formed between the first and second interlayer insulating films when the device has a CMOS structure in which transistors of reverse conductivity types are provided adjacently to each other with a PTI interposed therebetween, micro-defects are generated in the semiconductor layer below the isolation insulating film and the breakdown voltage increases between a pMOS transistor and an nMOS transistor which are adjacent to each other and therefore the reliability of the semiconductor device can be improved.

In the method of the twelfth aspect of the present invention, since the first and second interlayer insulating films are etched in the steps independently of each other to form the contact holes, the overetching of the semiconductor layer can be prevented by controlling the etching condition of the first interlayer insulating film and therefore a semiconductor device which has no possibility of generating a junction leak current can be obtained.

In the method of the thirteenth aspect of the present invention, since the etching of the first interlayer insulating film and that of the second interlayer insulating film are separately performed with the silicon nitride film to form the contact holes in the semiconductor device having a borderless contact structure in which the first and second wires connected to the first source region and drain region are formed across the adjacent isolation insulating films, the overetching of the semiconductor layer can be prevented by controlling the etching condition of the first interlayer insulating film and therefore a semiconductor device which has no possibility of generating a junction leak current can be obtained. Further, the isolation insulating film is prevented from being etched when the contact holes reaching the first source/drain regions are formed and sufficient distances from the pn junctions between the semiconductor layer and the first source/drain regions to the first and second wires can be ensured, whereby a semiconductor device of higher element density and higher reliability can be obtained.

In the method of the fourteenth aspect of the present invention, since the etchings of the first and second interlayer insulating films are performed by utilizing the selection ratios to the silicon nitride film formed between the first and second interlayer insulating films, the contact holes can be formed with good controllability, whereby a semiconductor device of higher reliability can be obtained.

An object of the present invention is to provide a semiconductor device comprising an isolation insulating film of PTI structure to collectively fix voltages of channel formation regions in a plurality of transistors, which suppresses the floating-body effect to improve isolation characteristics and breakdown voltage, and a method of manufacturing the same.

Another object of the present invention is to provide a semiconductor device of borderless contact structure which reduces the junction leak current to ensure downsizing and lower power consumption, and a method of manufacturing the same.

These and other objects, features, aspects and advantages of the present invention will become more apparent from the following detailed description of the present invention when taken in conjunction with the accompanying drawings.

DESCRIPTION OF THE PREFERRED EMBODIMENTS

The First Preferred Embodiment

Figure 1:
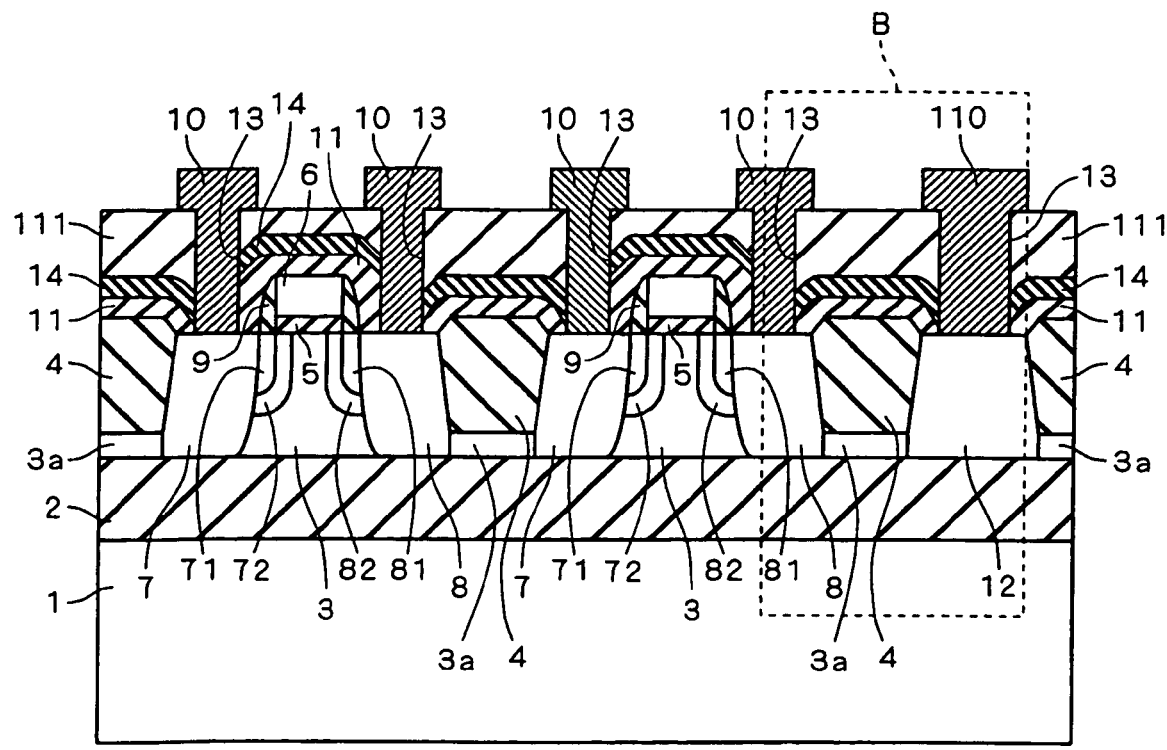
FIG. 1 is a cross section showing a semiconductor device in accordance with a first preferred embodiment of the present invention.

FIG. 1 is a cross section showing a semiconductor device in accordance with the first preferred embodiment of the present invention. The semiconductor device of FIG. 1 comprises a semiconductor substrate 1, a buried oxide film 2, a semiconductor layer 3, an isolation insulating film 4, a gate insulating film 5, a gate electrode 6, source/drain regions 7, 71, 8, and 81, pocket implantation regions 72 and 82, a sidewall insulating film 9, wires 10 and 110, interlayer insulating films 11 and 111, a p-type impurity region 12, a contact hole 13 and a silicon nitride film 14. Further, the semiconductor layer 3 (the first semiconductor region) below the isolation insulating film 4 is particularly represented as 3a.

Figure 2:
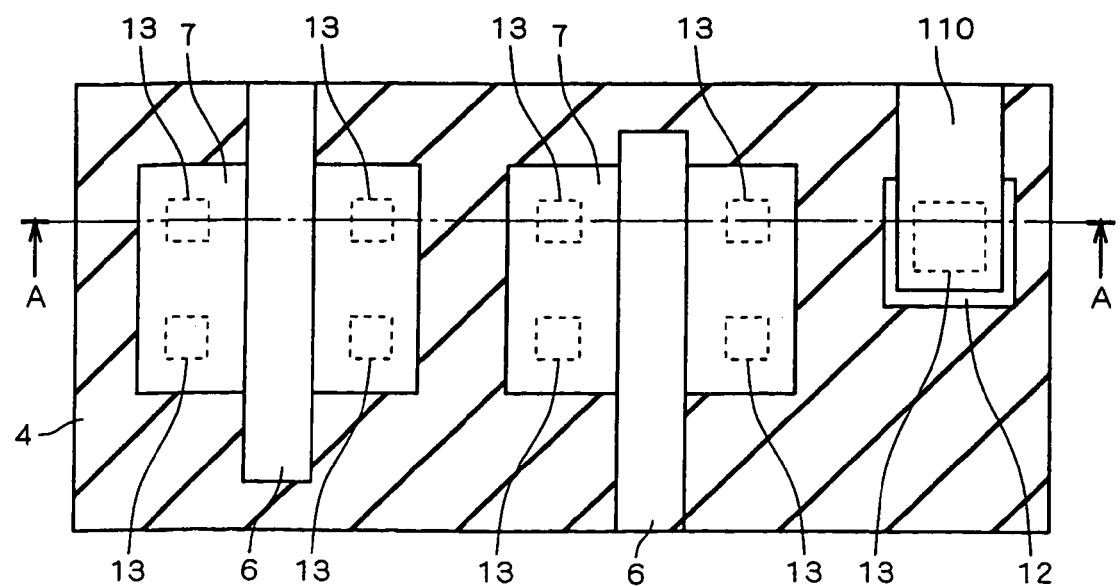
FIG. 2 is a plan view showing the semiconductor device in accordance with the first preferred embodiment of the present invention.

FIG. 2 is a plan view showing the semiconductor device in accordance with the first preferred embodiment of the present invention. FIG. 1 is the cross section taken along the section A-A of FIG. 2. In FIG. 2, the interlayer insulating films 11 and 111, the silicon nitride film 14, the wire 10, the sidewall insulating film 9, the source/drain regions 71 and 81 and the pocket implantation regions 72 and 82 are omitted for convenience of illustration.

Referring to FIG. 1, a structure in which the semiconductor layer 3 is formed entirely over the semiconductor substrate 1 with the buried oxide film 2 interposed therebetween is termed an SOI substrate, which can be formed by any method of bonding method, the SIMOX method and the like. The buried oxide film 2 has a thickness of about 100 to 500 nm, and the semiconductor layer 3 has a thickness of about 30 to 400 nm containing a p-type impurity such as boron of about $1 \times 10^{15}$ to $1 \times 10^{18}/cm^3$.

Active regions in which the transistors are formed are surrounded by a partial isolation region consisting of the p-type impurity region 12 and the isolation insulating film 4 (PTI) which is a silicon oxide film or the like, being isolated from one another. A minimum isolation width is about 200 nm. The isolation insulating film 4 has a thickness of about half to one third of that of the semiconductor layer 3, and is set so that the thickness of the semiconductor layer 3a therebelow should be about 15 to 200 nm.

Though it is desirable for microfabrication that the level of an upper surface of the isolation insulating film 4 should be equal to that of a surface of the semiconductor layer 3, when the semiconductor layer 3 is thin, making the level of the upper surface of the isolation insulating film 4 higher than that of the surface of the semiconductor layer 3 improves isolation performance since it becomes difficult to ensure the thickness sufficient for isolation if sufficient thickness of the semiconductor layer 3a below the isolation insulating film 4 is left. Though a silicon oxide film is used as the isolation insulating film 4 herein, other insulating films, such a silicon nitride film, a silicon oxynitride film, a silicon oxide film containing fluorine and a porous silicon oxide film, may be used. Further, between the semiconductor layer 3 and the isolation insulating film 4 formed is a silicon oxide film having a thickness of about 5 to 30 nm as needed (not shown).

The source/drain regions 7, 8, 71 and 81, the pocket implantation regions 72 and 82 and the p-type impurity region 12 are formed by implanting an impurity into the p-type semiconductor layer 3, and the p-type impurity region 12 contains boron or the like of about $1 \times 10^{17}$ to $1 \times 10^{18}/cm^3$. Further, the pocket implantation regions 72 and 82 each contains B, $BF_2$ or In of about $1 \times 10^{17}$ to $1 \times 10^{19}/cm^3$. The pocket implantation regions 72 and 82 serve to suppress a short channel effect and are not needed if the depth of junction of the gate insulating film and the source/drain regions is optimized.

Further, the source/drain regions 7 and 8 each containing an n-type impurity such as arsenic of about $1 \times 10^{19}$ to $1 \times 10^{21}/cm^3$ and the source/drain regions 71 and 81 each containing an n-type impurity such as phosphorus of about $1 \times 10^{18}$ to $1 \times 10^{20}/cm^3$ constitute an LDD (Lightly Doped Drain) structure. The LDD structure is formed as needed. Further, though FIG. 1 shows the source/drain regions 7 and 8 reaching the buried oxide film 2, these may not reach the buried oxide film 2.

As the gate insulating film 5, SiO$_2$, SiON, a layered film consisting of SiO$_2$, Si$_3$N$_4$ and SiO$_2$ (ONO), Ta$_2$O$_5$, Al$_2$O$_3$, a BST film (Ba$_x$Sr$_{1-x}$TiO$_3$: Barium Strontium Titanium) or the like may be used.

Though the gate electrode 6 contains an n-type impurity such as phosphorus of about 2 to 15×10$^{20}$/cm$^3$ and is made of polysilicon having a thickness of about 100 to 400 nm, it may be made of, instead of polysilicon, a layered structure consisting of a polysilicon containing an impurity and a metal silicide layer such as TiSi$_2$, CoSi$_2$, NiSi$_2$, WSi$_2$, TaSi$_2$, MoSi$_2$, HfSi$_2$, Pd$_2$Si, PtSi$_2$ or ZrSi$_2$, or a metal such as W, Mo, Cu or Al, and further may be made of a metal such as W, Mo, Cu or Al. Also on surfaces of the source/drain regions 7 and 8 and the p-type impurity region 12, a metal silicide such as TiSi$_2$, CoSi$_2$, NiSi$_2$, WSi$_2$, TaSi$_2$, MoSi$_2$, HfSi$_2$, Pd$_2$Si, PtSi$_2$ or ZrSi$_2$ may be formed (not shown).

The sidewall insulating film 9 is made of a silicon oxide film, a TEOS film, a Si$_3$N$_4$ film or a layered film consisting of Si$_3$N$_4$ and SiO$_2$, and a film containing nitrogen, such as the Si$_3$N$_4$ film or the layered film consisting of Si$_3$N$_4$ and SiO$_2$ eliminates the possibility of being etched even through a mask displacement in forming the contact hole 13. Further, by the synergistic effect with the silicon nitride film 14, it is possible to improve the density of micro-defects caused by stress in the semiconductor layer 3 which is to become a channel formation region near the source/drain regions 7 and 71 serving as a source region or the source/drain regions 8 and 81 and carriers (positive hole in an nMOS and electrons in a PMOS) are not easily accumulated near the source region, to further suppress the floating-body effect.

The interlayer insulating films 11 and 111 are each made of a silicon oxide film formed by the plasma CVD method, the LPCVD (Low Pressure Chemical Vapor Deposition) method, the atmospheric pressure CVD method or the like. The interlayer insulating film 11 has a thickness of about 10 to 300 nm and the interlayer insulating film 111 has a thickness of about 100 to 2000 nm. The interlayer insulating films 11 and 111 may be made of a TEOS film or a SOG (Spin On Glass) film, and further may be made of a PSG (Phospho Silicate Glass), a BSG (Boro silicate Glass), a BPSG (Boro Phospho Silicate Glass) or a BPTEOS (Boro Phospho TEOS), all of which contain an impurity, instead of the silicon oxide film.

The silicon nitride film 14 has a thickness of about 50 to 100 nm and is entirely formed except a portion where the contact holes 13 each having a diameter of 0.1 to 0.5 μm are formed. With the presence of the silicon nitride film 14, micro-defects are formed in the semiconductor layer 3 below the isolation insulating film 4.

Figure 3:
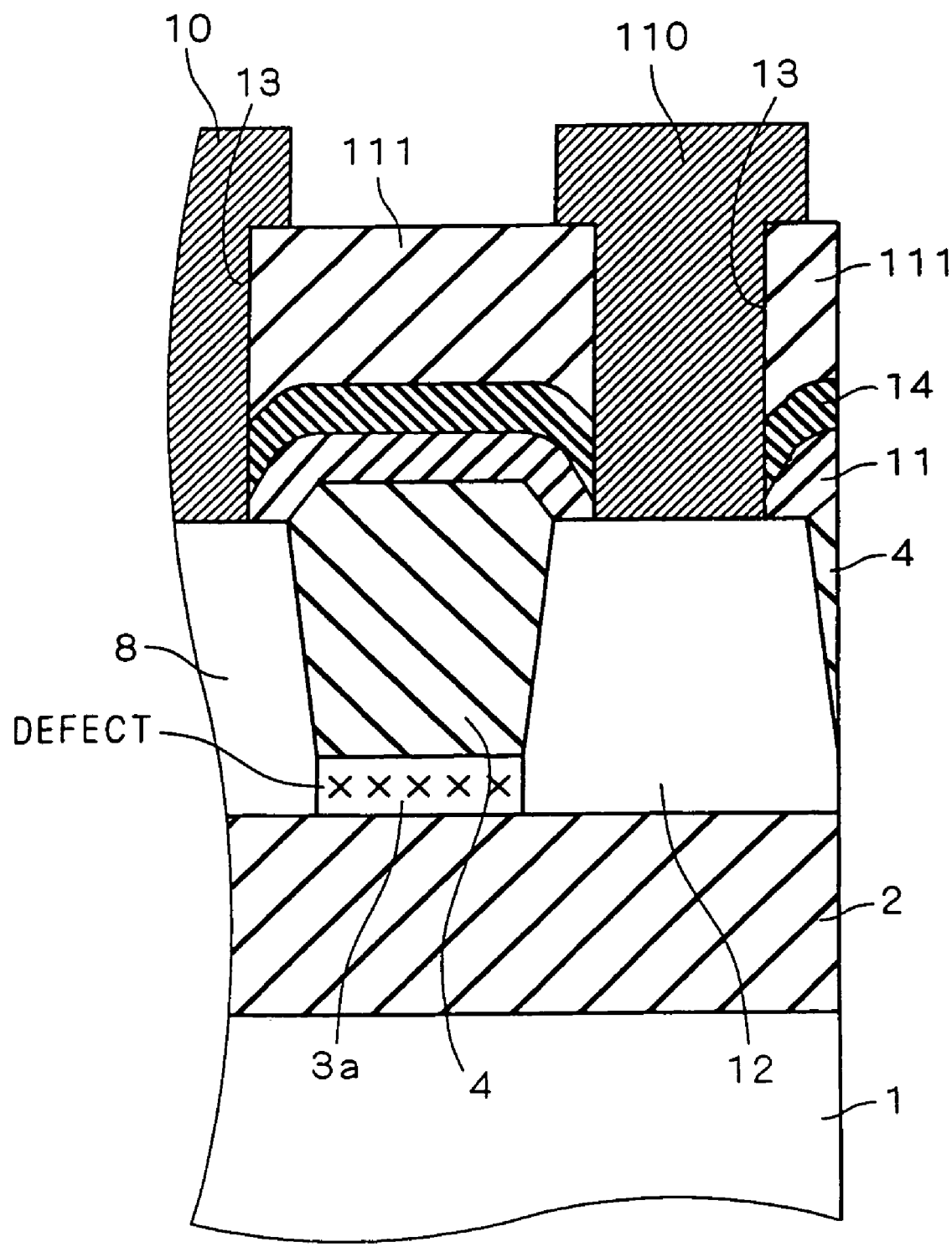
FIGS. 3 to 5 are cross sections showing the semiconductor device in accordance with the first preferred embodiment of the present invention.

FIG. 3 is a cross section showing the semiconductor device in accordance with the first preferred embodiment of the present invention and an enlarged view of a portion enclosed by the broken line B in FIG. 1. As shown in FIG. 3, the micro-defect is formed in the semiconductor layer 3$a$ below the isolation insulating film 4.

It is generally known that the silicon nitride film is made of Si$_3$N$_4$ having a stress of about 1×10$^{11}$ dyn/cm$^2$, and the film stress can be controlled depending on the ratio of N to Si of Si$_x$N$_y$. Further, since the film stress can be also controlled by adding O to change the composition ratio of O and N, a silicon oxynitride film (SiON) may be formed, instead of the silicon nitride film.

Next, an operation will be discussed. Referring to FIG. 1, in a case of NMOS transistor, for example, voltages to be applied to the electrodes are as follows. A gate voltage V$_G$ is about 1.8 V, a drain voltage V$_D$ is about 1.8 V, a source voltage V$_S$ is about 0 V and a body voltage (the voltage to be applied to the wire 110) V$_B$ is about 0 V. A channel is formed in a surface of the semiconductor layer 3 below the gate electrode 6, and one of the source/drain region 7 or 71 and the source/drain region 8 or 81 serves as the source region and the other serves as the drain region, which operates as a circuit. Since the semiconductor layer 3$a$ below the isolation insulating film 4 contains a p-type impurity like the semiconductor layer 3 below the gate electrode 6 and the impurity region 12 and is electrically connected to the semiconductor layer 3 below the gate electrode 6 and provided adjacently to these two, a voltage is applied to the semiconductor layer 3 below the gate electrode 6 from the wire 110 through the impurity region 12.

Those voltage values are examples, and can vary depending on the thickness of the gate insulating film and the gate length.

The case of forming an nMOS transistor is discussed in the first preferred embodiment. In a case of forming a pMOS transistor, the semiconductor layer 3 contains an n-type impurity such as phosphorus or arsenic, the source/drain regions 7, 8, 71 and 81 contain a p-type such as boron, pocket implantation regions 72 and 82 contain an n-type impurity such as arsenic (As), phosphorus (P) or antimony (Sb) and the gate electrode 6 contains a p-type impurity such as boron. Further, an n-type impurity region is formed, instead of the p-type impurity region 12. In this case, the gate voltage V$_G$ is about 0 V, the drain voltage V$_D$ is about 0 V, the source voltage V$_S$ is about 1.8 V and the body voltage V$_B$ is about 1.8 V.

Though an exemplary arrangement of the wires 10 and 110 is shown in this preferred embodiment, the number of layers of the interlayer insulating films formed between the wire and the transistor and the arrangement are changed depending on the circuit configuration. Further, though the discussion is made taking an example of the semiconductor device in which one transistor is formed in one active region, the configuration is not limited to this.

Though the discussion is made referring to the figure in which the silicon nitride film 14 is entirely formed in the first preferred embodiment, the isolation performance can be improved only if the silicon nitride film 14 is formed in a region in which the PTI is used as device isolation in a semiconductor device in which the PTI and the FTI are used together (not shown).

Figure 4:
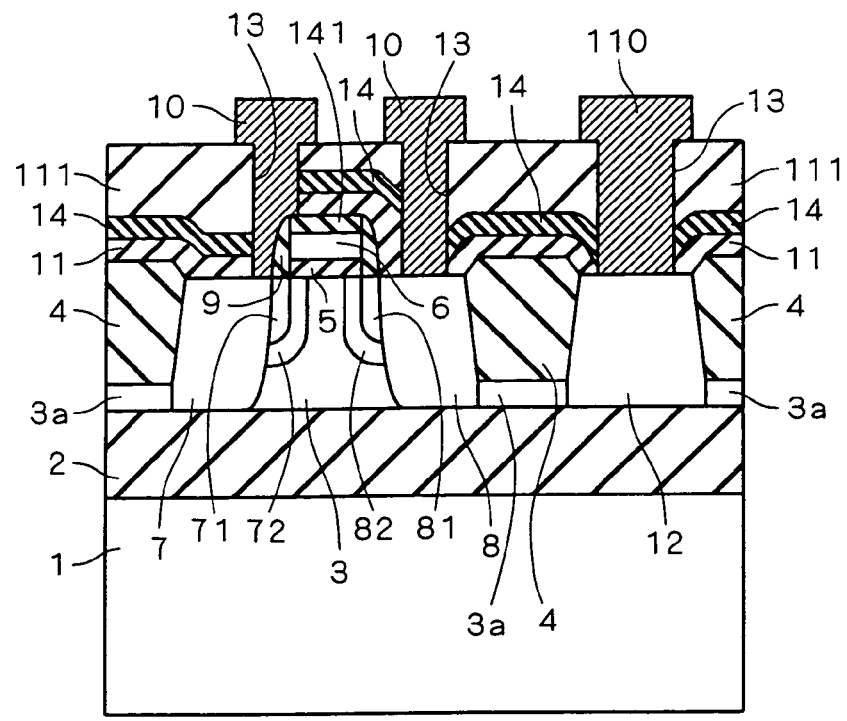

FIG. 4 is a cross section showing another semiconductor device in accordance with the first preferred embodiment of the present invention, showing a silicon nitride film 141. When the sidewall insulating film 9 is formed of a film containing nitrogen such as the Si$_3$N$_4$ film or the layered film consisting of Si$_3$N$_4$ and the SiO$_2$ and as shown in FIG. 4, the silicon nitride film 141 is formed on a surface of the gate electrode 6, it is possible to more surely eliminate the possibility of electrical connection between the gate electrode 6 and the wire 10 even if the wire 10 is formed near the gate electrode 6.

Figure 5:
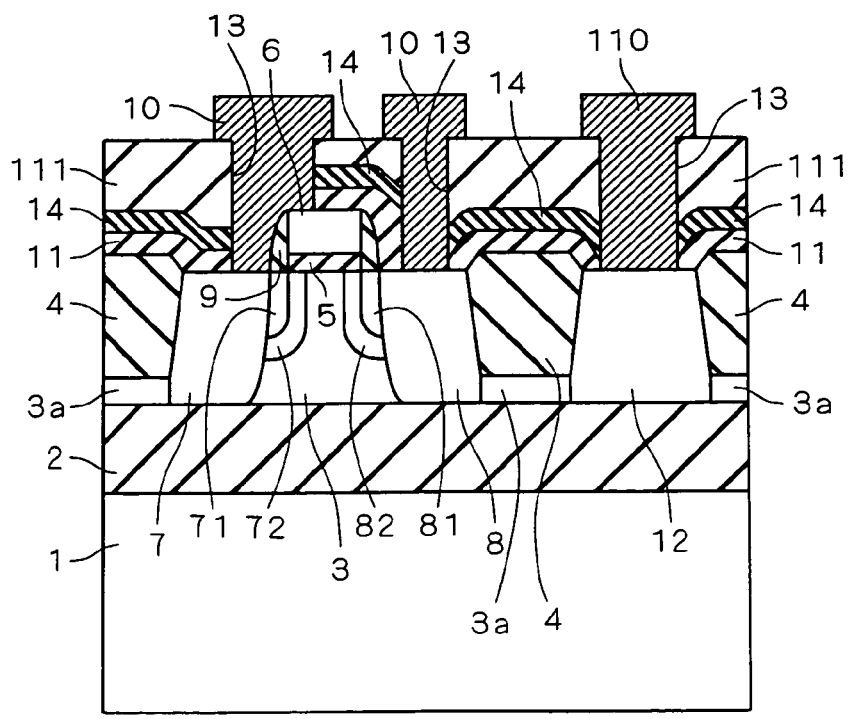
Figure 6:
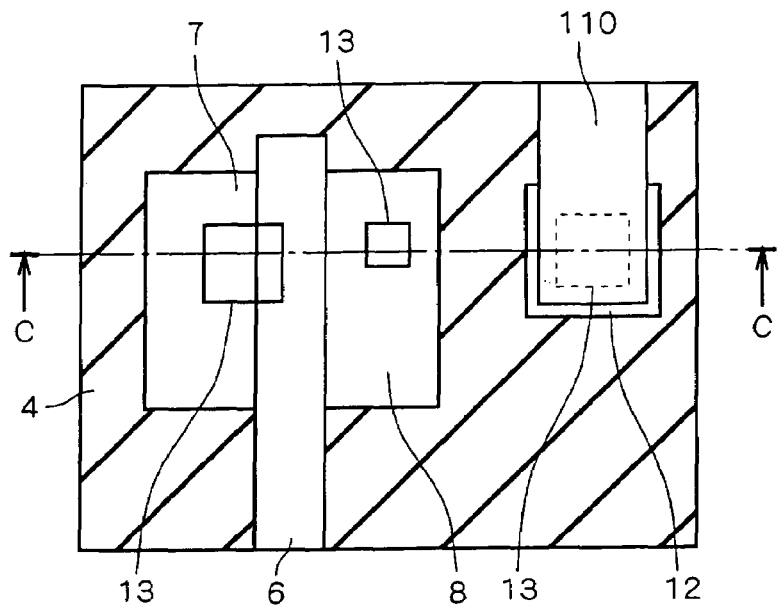
FIG. 6 is a plan view showing the semiconductor device in accordance with the first preferred embodiment of the present invention.

FIG. 5 is a cross section showing still another semiconductor device in accordance with the first preferred embodiment of the present invention. FIG. 6 is a plan view showing this semiconductor device in accordance with the first preferred embodiment of the present invention. The cross section of FIG. 5 is taken along the section C-C of FIG. 6. Referring to these figures, the semiconductor device comprises the wire 10 connected to both the gate electrode 6 and the source/drain region 7, and the diameter of the contact hole in this portion is twice as large as that in other portions. This structure of the semiconductor device is generally referred to as a shared contact structure and is used for an SRAM memory in which the gate electrode 6 and the source/drain region 7 always operate at the same potential. The semiconductor device of FIGS. 5 and 6 has the same structure as that of FIG. 1 except this interconnection structure.

Figure 7:
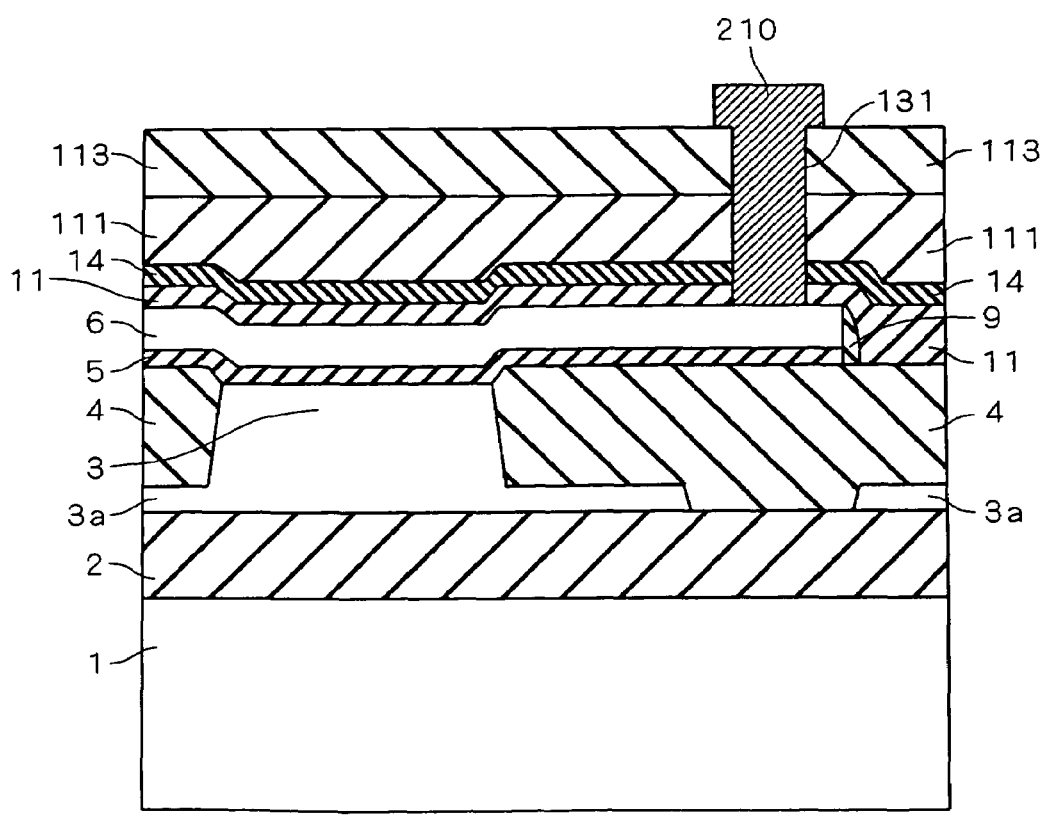
FIG. 7 is a cross section showing the semiconductor device in accordance with the first preferred embodiment of the present invention.

FIG. 7 is a cross section showing yet another semiconductor device in accordance with the first preferred embodiment of the present invention, and the semiconductor device of FIG. 7 comprises an interlayer insulating film 113, a contact hole 131 and a wire 210. Referring to this figure, the wire 210 is connected to the gate electrode 6 through the contact hole 131 formed in the interlayer insulating film 113, and a region where the contact hole 131 is formed has the same structure as that in the semiconductor device of FIGS. 1 and 2 except that the isolation insulating film 4 is the FTI reaching the buried oxide film 2.

Figure 8:
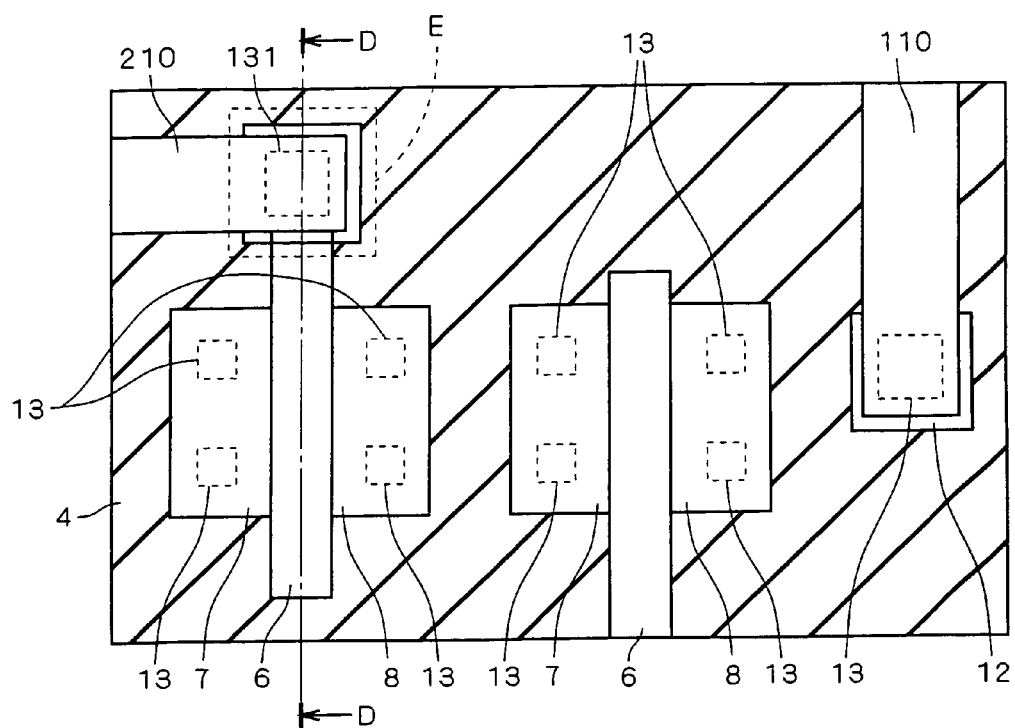
FIG. 8 is a plan view showing the semiconductor device in accordance with the first preferred embodiment of the present invention.

FIG. 8 is a plan view showing the semiconductor device of FIG. 7, and FIG. 7 is the cross section taken along the section D-D of FIG. 8. Referring to 8, a portion enclosed by the broken line E is the FTI. In FIG. 8, the interlayer insulating film is not shown for simple illustration.

Thus, using the FTI and the PTI together eliminates the possibility that the isolation insulating film 4 should be etched to reach the semiconductor layer 3 even if there is a mask displacement in forming the contact hole 131.

According to the first preferred embodiment, since the semiconductor device in which the element is formed on the main surface of the SOI substrate consisting of the semiconductor substrate 1, the buried oxide film 2 provided entirely over the surface of the semiconductor substrate 1 and the semiconductor layer 3 provided on the surface of the buried oxide film 2 comprises the silicon nitride film 14 formed on a surface of the element with the interlayer insulating film 11 interposed therebetween, micro-defects which develop into lifetime killers are generated in the semiconductor layer 3a below the isolation insulating film 4 by a stress of the silicon nitride film 14 and this shorten the lifetime of carriers (positive hole in an NMOS and electrons in a pMOS). Therefore, since this produces the same effect as ensures lower resistance of the semiconductor layer 3a below the isolation insulating film 4, even if the thickness of the semiconductor layer 3a below the isolation insulating film 4 becomes thinner, a potential of the channel formation region below the gate electrode 6 can be stably fixed and a floating-body effect, such as the frequency dependency of delay time, can be suppressed, whereby the reliability of the semiconductor device can be improved.

Further, though it is known that the hot carrier tolerance is deteriorated if the hydrogen enters the gate insulating film 5 and the hydrogen termination occurs at the interface of the semiconductor layer 3, the gate insulating film 5 and the buried oxide film 2 when an annealing under a hydrogen atmosphere in the last step is executed, since the silicon nitride film 14 is formed in the semiconductor device of this preferred embodiment, it is possible to prevent entry of hydrogen into the gate insulating film 5 and the buried oxide film 2 and this improves the hot carrier resistance.

By controlling the ratio of N to Si in the silicon nitride film 14 or controlling the ratio of O and N in the silicon oxynitride film instead of the silicon nitride film, the film stress of the silicon nitride film or the silicon oxynitride film can be increased and the density of micro-defects generated in the semiconductor layer below the isolation insulating film of PTI can be increased, whereby the function of the lifetime killer can be improved.

Figure 9:
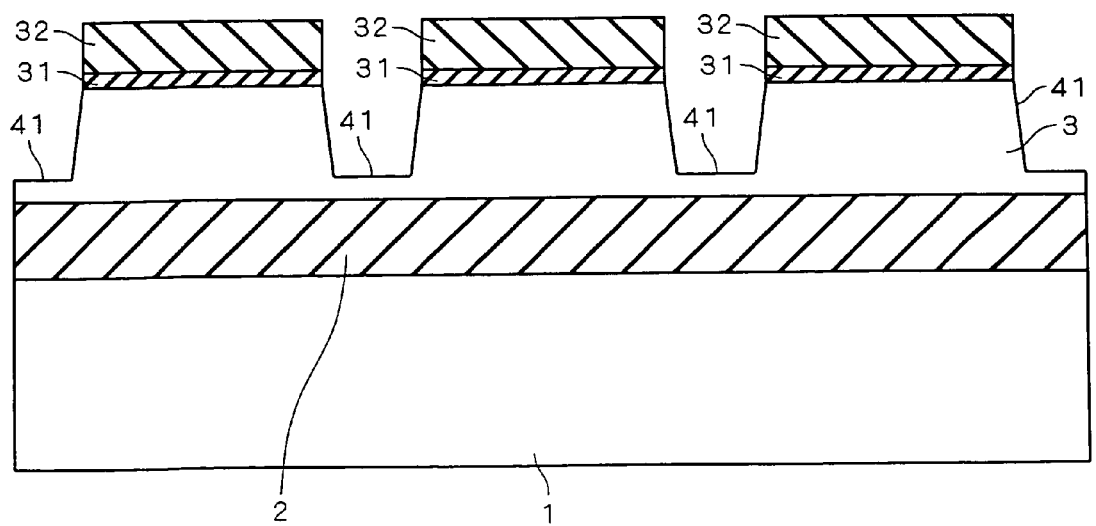
FIGS. 9 to 13 are cross sections each showing a process step in a method of manufacturing a semiconductor device in accordance with the first preferred embodiment of the present invention.

Next, discussion will be made on a method of manufacturing the semiconductor device in accordance with the first preferred embodiment of the present invention. FIGS. 9 to 13 are cross sections each showing a process step in the method of manufacturing the semiconductor device in accordance with the first preferred embodiment. FIG. 9 shows a silicon oxide film 31, a silicon nitride film 32 and a trench 41. Referring to FIG. 9, the silicon oxide film 31 having a thickness of about 5 to 40 nm is formed on the surface of the semiconductor layer 3 in the SOI substrate which comprises the buried oxide film 2 and the semiconductor layer 3 on the surface of the semiconductor substrate 1. To form the silicon oxide film 31, a thermal oxidation method, a method of forming the TEOS oxide film by the CVD and the like may be used.

The silicon nitride film 32 having a thickness of about 50 to 300 nm is formed on the silicon oxide film 31 by the LPCVD method or the plasma nitride film CVD method, and the silicon nitride film 32 and the silicon oxide film 31 on an isolation region are selectively removed through anisotropic etching by RIE (Reactive Ion Etching) or ECR (Electron Cyclotron Resonance) device with a photoresist mask (not shown). After removing the photoresist mask, the semiconductor layer 3 is anisotropically etched with the silicon nitride film 32 used as a mask by using RIE or the ECR device, to form the trench 41 having a depth of about 20 to 300 nm in the surface of the semiconductor layer 3. The trench 41 has a width of about 100 to 500 nm and is formed so that the semiconductor layer 3 of about 10 to 100 nm should be left therebelow. FIG. 9 is the cross section showing the elements of the semiconductor device at the end of this step.

Figure 10:
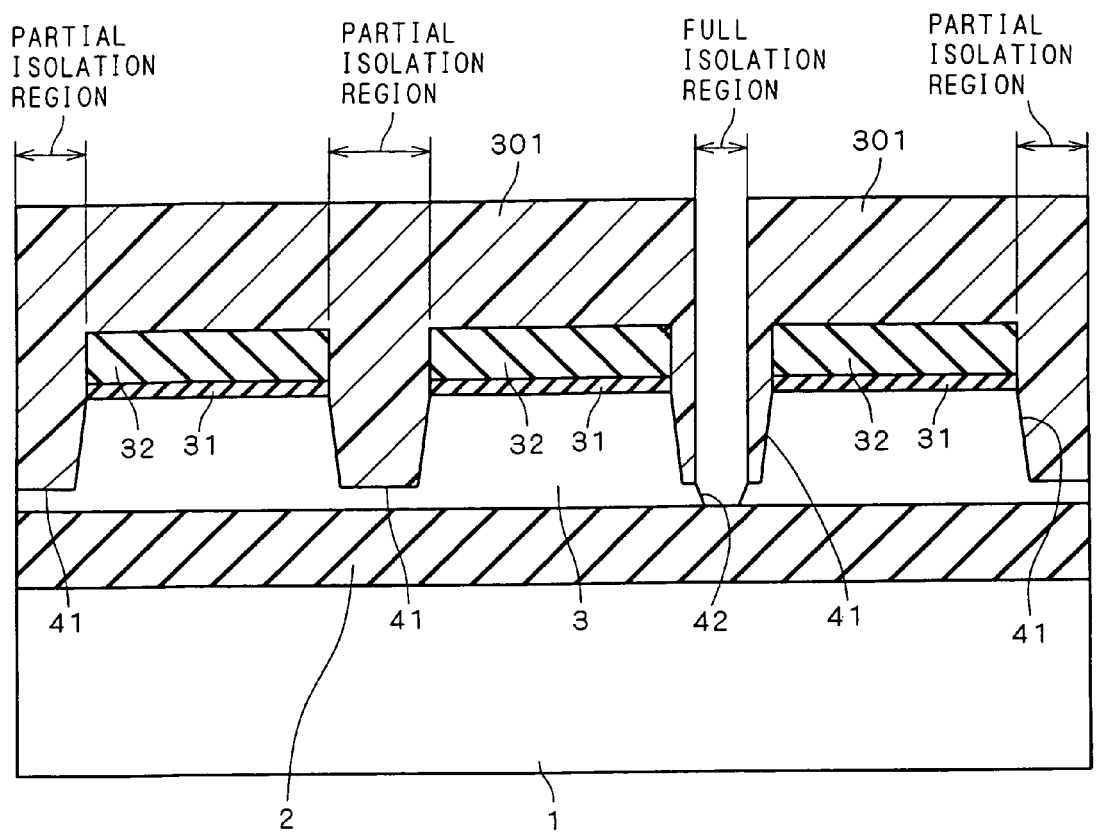

FIG. 10 shows a trench 42 and a photoresist mask 301. In a case of using the PTI and the FTI together, after the step of FIG. 9, the photoresist mask 301 having an opening at a portion in which the FTI is to be formed is formed and a bottom surface of the trench 41 is etched therewith, to form the trench 42 reaching the buried oxide film 2. The photoresist mask 301 may be formed inside the trench 41 or may be formed on the surface of the silicon nitride film 32.

Figure 11:
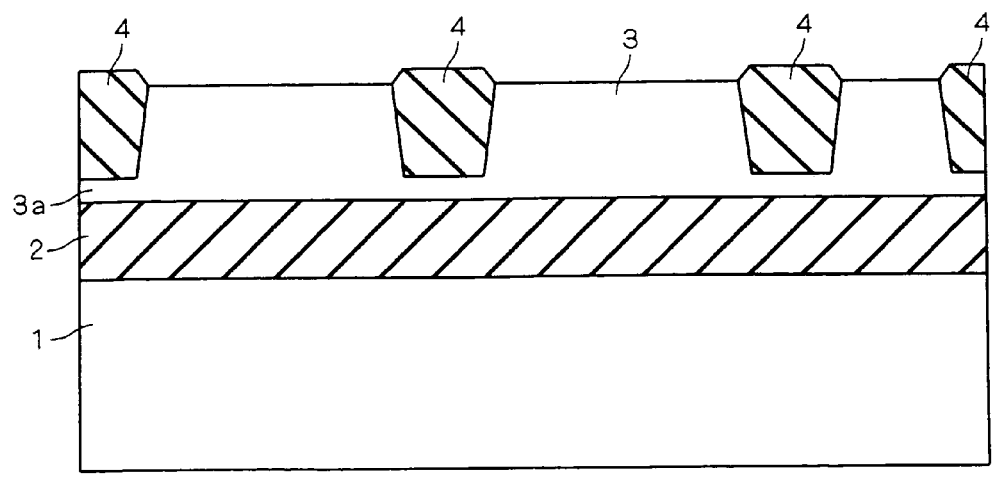
Figure 12:
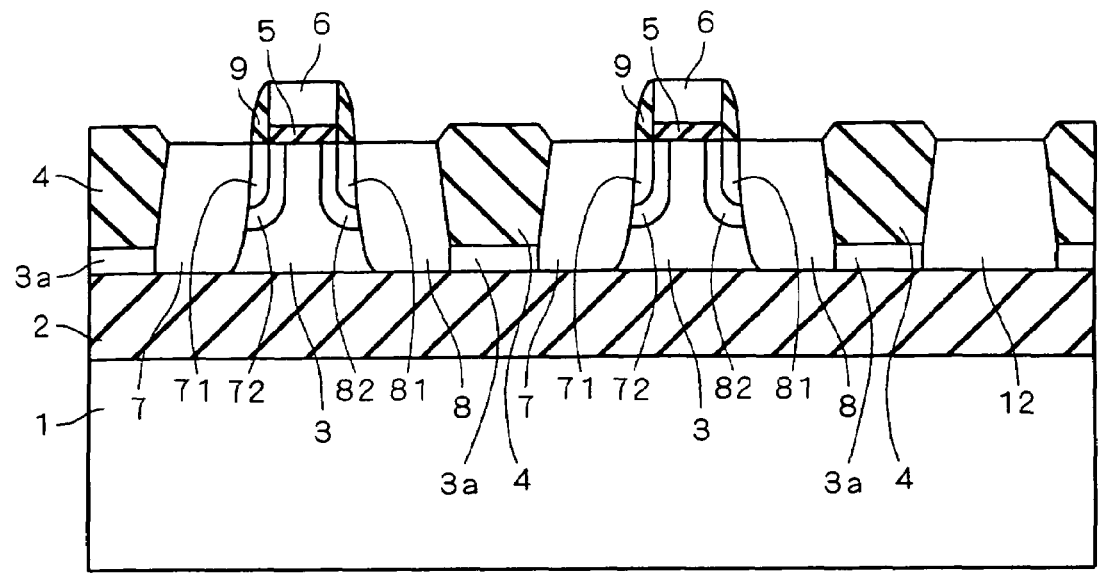
Figure 13:
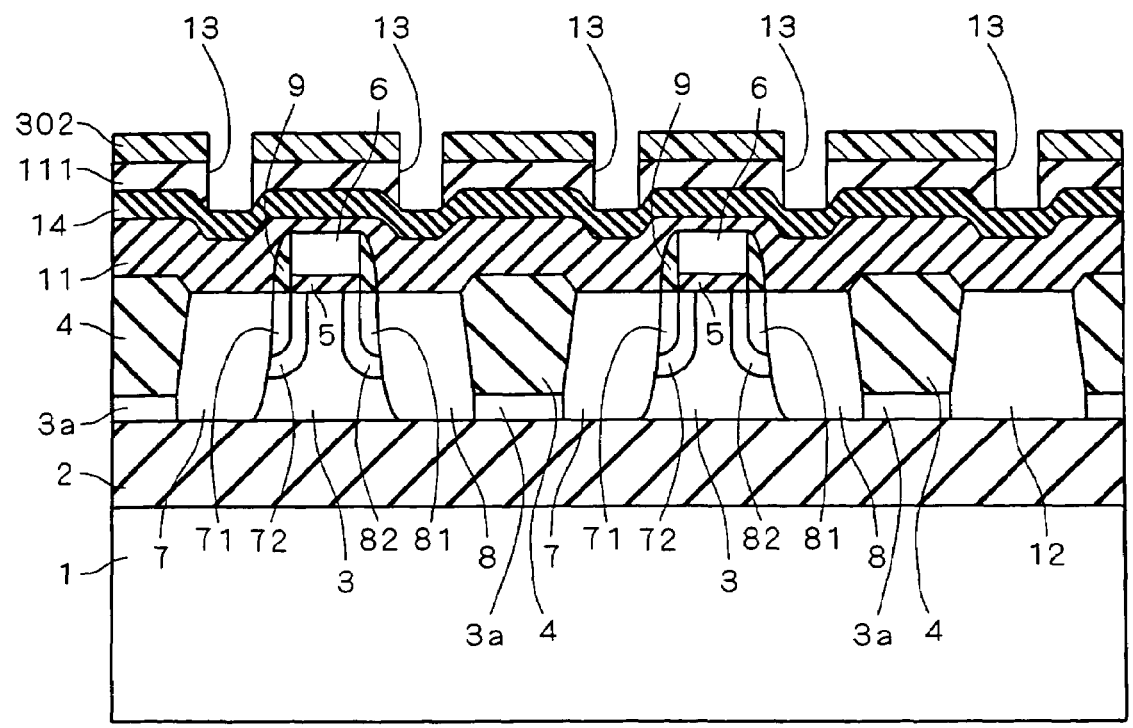

A silicon oxide film is entirely formed to have a thickness of about 100 to 500 nm (not shown) by a plasma TEOS or an HDP (High Density Plasma) apparatus, and thermally treated at about 1000° to 1100° C., to enhance the film quality. Then, the silicon oxide film on the surface of the silicon nitride film 32 is removed by the CMP (Chemical Mechanical Polishing) method with the silicon nitride film 32 used as a stopper, to leave the silicon oxide film only inside an opening constituted of the trench 41, the silicon oxide film 31 and the silicon nitride film 32. After that, the silicon oxide film is etched in order to eliminate the level difference between a surface of the silicon oxide film inside the opening and the surface of the semiconductor layer 3, and then the silicon nitride film 32 is removed by wet etching with thermal phosphoric acid and the silicon oxide film 31 is removed, to form the isolation insulating film 4. The semiconductor layer 3 below the isolation insulating film 4 corresponds to the semiconductor layer 3a. FIG. 11 is the cross section showing the state at the end of this step. FIGS. 11 to 13 show only the PTI structure.

By performing a high-temperature thermal oxidation at about 900° to 1000° C. inside the trench 41 before the silicon oxide film is deposited, a corner of the silicon formed by the bottom surface and side surface of the trench 41 and a corner of the silicon formed by the side surface of the trench 41 and the surface of the semiconductor layer 3 are rounded, and this relieves the stress in this portion.

A silicon oxide film is entirely formed by the thermal oxidation (not shown), and then a photoresist mask (not shown) having an opening at a portion in which the wires are to be formed to fix the potential of the channel formation region is formed. In the case of nMOS, a p-type impurity such as B, $BF_2$ or In is ion-implanted to form the p-type impurity region 12 having an impurity concentration of about $1 \times 10^{17}$ to $1 \times 10^{18}/cm^3$. In the case of pMOS, an n-type impurity such as P, As or Sb is ion-implanted to form an n-type impurity region.

Further, as needed, an impurity such as boron or boron fluoride in the case of nMOS or an impurity such as phosphorus or arsenic in the pMOS, is entirely ion-implanted at an energy of 10 to 20 keV at a dose of about $1 \times 10^{12}$ to $5 \times 10^{12}/cm^2$, to introduce the impurity into the channel formation region for controlling the threshold value (not shown). The silicon oxide film is formed in order to protect the surface of the semiconductor substrate from a damage in ion-implantation and removed after this ion implantation.

Next, referring to FIG. 12, a silicon oxide film, for example, is formed as the gate insulating film 5 entirely over the surface of the semiconductor layer 3 by the thermal oxidation to have a thickness of about 7 to 10 nm, and a polysilicon layer for the gate electrode 6 is deposited entirely by the LPCVD method to have a thickness of about 100 to 400 nm and patterned with a photoresist mask (not shown) by using an anisotropic etching device such as RIE or ECR, to form the gate electrode 6. At this time, there may be a case where a silicon oxide film or a layered film consisting of a silicon nitride film and a silicon oxide film is formed on a surface of the polysilicon layer, this film is once patterned with the photoresist mask, and then the polysilicon layer is processed with the patterned film. Further, there may another case where the metal silicide layer such as WSi is deposited on the surface of the polysilicon layer, and then this film is patterned.

After that, an impurity such as boron or boron fluoride in the case of nMOS or an impurity such as phosphorus or arsenic in the pMOS, is ion-implanted at a dose of about $1 \times 10^{12}$ to $1 \times 10^{14}/cm^2$, to form the pocket implantation regions 72 and 82.

Then, an impurity such as phosphorus or arsenic in the case of nMOS or an impurity such as boron or boron fluoride in the pMOS, is ion-implanted at an energy of 20 to 40 keV at a dose of about $10^{14}$ to $10^{15}/cm^2$, to form the source/drain regions 71 and 81.

Next, a silicon oxide film is entirely deposited by the plasma CVD method to have a thickness of about 30 to 100 nm and etched back, to form the sidewall insulating film 9, and after that, an impurity such as arsenic in the case of nMOS or an impurity such as boron or boron fluoride in the pMOS, is ion-implanted at an energy of 10 keV at a dose of about $1 \times 10^{14}$ to $1 \times 10^{16}/cm^2$, to form the source/drain regions 7 and 8. FIG. 12 is the cross section showing the element of the semiconductor device at the end of this step.

As the sidewall insulating film 9, the TEOS film may be used, or the $Si_3N_4$ or the layered film consisting of $Si_3N_4$ and $SiO_2$ may be formed by the LPCVD method or the plasma CVD method. For example, in a case of the layered film, a silicon oxide film is formed by RTO (Rapid Thermal Oxidation) and a silicon nitride film is deposited thereon by the CVD method and etched back.

Since there may be a case where no pocket implantation region 72 or 82 is formed and the source/drain regions may have an LDD structure as needed, in some cases, no source/drain region 7 or 8 is formed. The implanted impurity is annealed at about 800° to 1150° C. for about 10 to 30 minutes to be activated.

If the metal silicide layer such as $CoSi_2$ is formed on the surfaces of the gate electrode 6 and the source/drain regions 7 and 8, cobalt should be entirely deposited and the RTA (Rapid Thermal Anneal) is performed in this stage. This causes the silicon to react on the exposed surfaces of the gate electrode 6 and the source/drain regions 7 and 8, whereby the metal silicide layer is formed in this portion. After that, the unreacted cobalt is removed (not shown). Other than $CoSi_2$, metal silicides such as $TiSi_2$, $NiSi_2$, $WSi_2$, $TaSi_2$, $MoSi_2$, $HfSi_2$, PdSi, $PtSi_2$ and $ZrSi_2$ may be used.

FIG. 13 shows a photoresist mask 302.

Referring to FIG. 13, a silicon oxide film for the interlayer insulating film 11 is deposited by the plasma CVD method, the LPCVD method, the atmospheric pressure CVD method or the like to have a thickness of about 10 to 300 nm, The interlayer insulating film 11 may be made of a TEOS film, a SOG film, and further may be made of a PSG, a BSG, a BPSG or a BPTEOS, all of which contain an impurity, instead of the silicon oxide film. The above steps of depositing an oxide film can be omitted as needed.

After that, the silicon nitride film 14 is formed by the LPCVD method (at 600° to 800° C.), the plasma CVD method (at 300° to 500° C.), the atmospheric pressure CVD method (at 3000 to 500° C.) or the like to have a thickness of about 50 to 100 nm. Instead of the silicon nitride film $Si_3N_4$, $SiO_xN_y$ may be used, and the composition of Si and N may be made different from that of $Si_3N_4$. A film formed by the LPCVD method has advantages of good uniformity in film thickness and high denseness and chemical stability. A film formed by the plasma CVD method or the atmospheric pressure CVD method, which can be formed at low temperature, can advantageously suppress the TED (Transient Enhanced Diffusion) of the impurity and therefore improve the current driving capability of a transistor. Further, in the plasma CVD method, it is easy to control the composition ratio of Si and N of the silicon nitride film and therefore it becomes easy to control the stress.

The interlayer insulating film 111 is formed to have a thickness of about 100 to 2000 nm in the same manner as the interlayer insulating film 11 and then planarized by the CMP method. After the planarization, to eliminate the raggedness in the surface through the CMP, a silicon oxide film is deposited again to have a thickness of about 50 to 200 nm in the same manner as the interlayer insulating film 11 is formed (not shown).

After forming the photoresist mask 302 having an opening at a region in which the contact holes 13 to be connected to the source/drain regions 7 and 8 and the p-type impurity region 12 are to be formed on the surface of the interlayer insulating film 111, the interlayer insulating film 111 is etched with an etching gas such as $C_xF_y$ (e.g., x=4, y=8) which has high selection ratio to the silicon nitride film 14 by the RIE, the magnetron RIE, the ECR device or the like, to form the trench 13. At this time, $H_2$ and CO may be used as an additive gas. FIG. 13 is the cross section showing the element of the semiconductor device at the end of this step.

Next, the remaining silicon nitride film 14 and interlayer insulating film 11 are etched under the condition of lower selection ratio of the silicon nitride film and the silicon oxide film, to dig the trench 13 deeper, whereby the contact hole 13 is formed.

Then, tungsten (W) is deposited by the blanket CVD method, to fill the inside of the contact hole 13 and etched back for planarization. After that, aluminum (Al) is entirely deposited and patterned, to form the wires 10 and 110 made of W and Al, whereby the semiconductor device shown in FIG. 1 is obtained.

After this, an interlayer insulating film and a wire are further layered in the same process as the interlayer insulating film 111 and the wires 10 and 110 are formed (not shown).

The method of depositing W for the wires 10 and 110 may be a selective CVD method, or instead of W, Al may be deposited by high-temperature sputtering or reflow sputtering, or TiN or doped polysilicon may be deposited by the LPCVD method. Instead of Al, AlCuSi, Cu or doped polysilicon may be used.

When a metal is used as a material for the wire, a barrier metal made of TiN or the like is formed on an inner wall of each contact hole to prevent the metal from diffusing onto the semiconductor layer 3.

Though the contact holes and the wires connected to the source/drain regions and the p-type impurity region are formed in the same process step in this preferred embodiment, the contact holes and the wires may be formed in different steps according to a circuit configuration and the order of formation may be changed as needed.

Further, when the metal silicide layer is formed on the surfaces of the source/drain regions 7 and 8 by salicide method, the metal silicide layer serves as an etching stopper in etching the interlayer insulating film 11 and therefore the etching margin increases.

According to the method of manufacturing the semiconductor device of the first preferred embodiment, since the semiconductor device in which the element is formed on the main surface of the SOI substrate consisting of the semiconductor substrate 1, the buried oxide film 2 provided entirely over the surface of the semiconductor substrate 1 and the semiconductor layer 3 provided on the surface of the buried oxide film 2 comprises the silicon nitride film 14 formed on a surface of the element with the interlayer insulating film 11 interposed therebetween, micro-defects which develop into lifetime killers are generated in the semiconductor layer 3a below the isolation insulating film 4 by a stress of the silicon nitride film 14 and this shorten the lifetime of carriers (positive hole in an nMOS and electrons in a pMOS). Therefore, even if the thickness of the semiconductor layer 3a below the isolation insulating film 4 becomes thinner, a potential of the channel formation region below the gate electrode 6 can be stably fixed and a floating-body effect, such as the frequency dependency of delay time, can be suppressed, whereby the semiconductor device of higher reliability can be manufactured.

Further, though it is known that the hot carrier resistance is deteriorated if the hydrogen enters the gate insulating film 5 and the hydrogen termination occurs at the interface of the semiconductor layer 3 and the gate insulating film 5, since the silicon nitride film 14 is formed in the semiconductor device of this preferred embodiment, it is possible to prevent entry of hydrogen into the gate insulating film 5 and the buried oxide film 2, whereby the semiconductor device of improved hot carrier resistance can be manufactured. Particularly, the above feature has a high degree of effectiveness on a SOI substrate comprising two oxide films (gate insulating film and buried oxide film) having an effect on device properties as compared to a balk substrate.

Furthermore, since the thick interlayer insulating film 111 on the silicon nitride film 14 and the thin interlayer insulating film 11 below the silicon nitride film 14 are separately etched with the silicon nitride film 14 to form the contact holes, it is possible to prevent overetching of the semiconductor layer by controlling the etching condition of the interlayer insulating film below the silicon nitride film, whereby the semiconductor device which has no possibility of generating the junction leak current can be obtained.

The Second Preferred Embodiment

Figure 14:
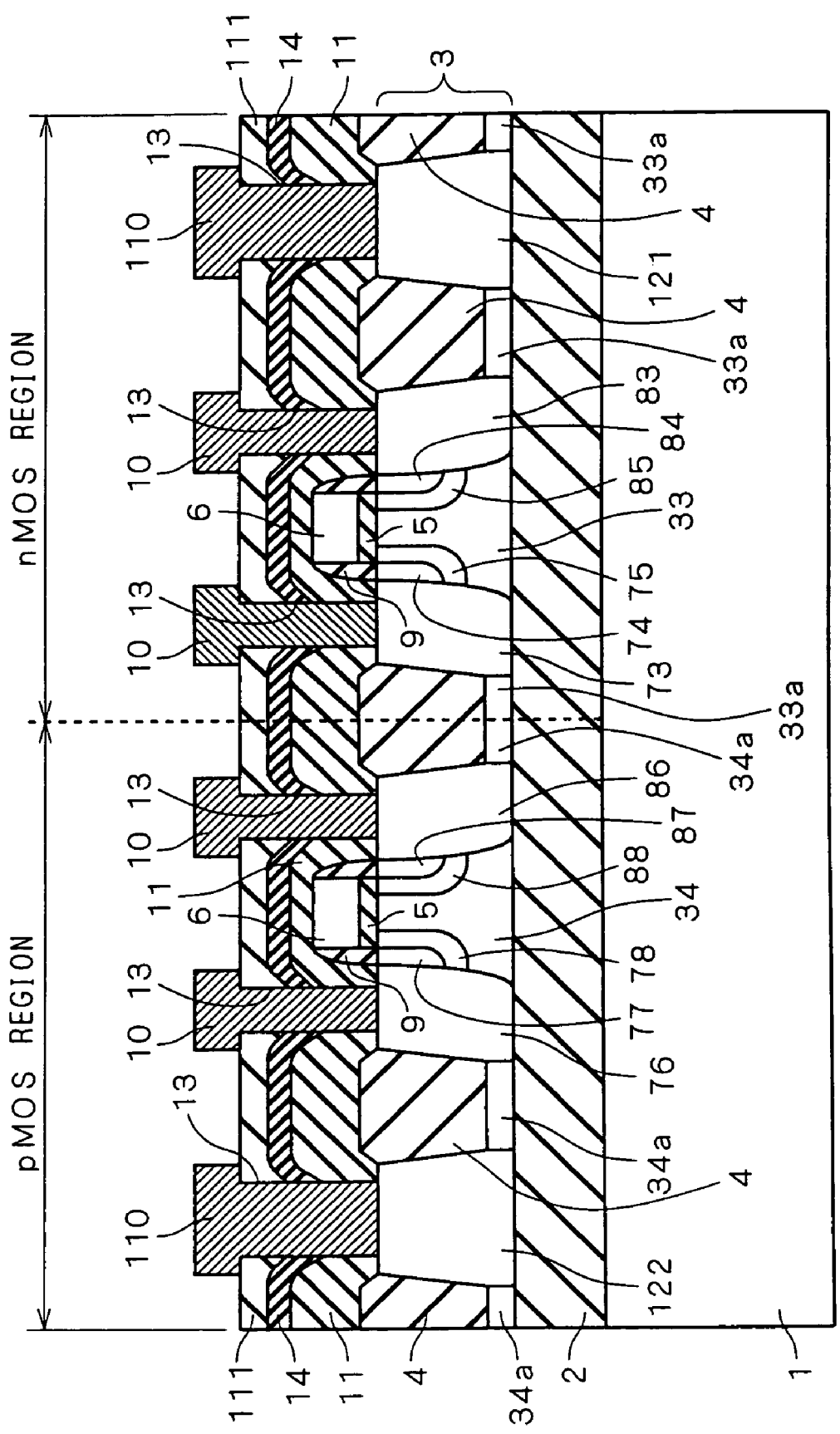
FIGS. 14 and 15 are cross sections each showing a semiconductor device in accordance with a second preferred embodiment of the present invention.
Figure 15:
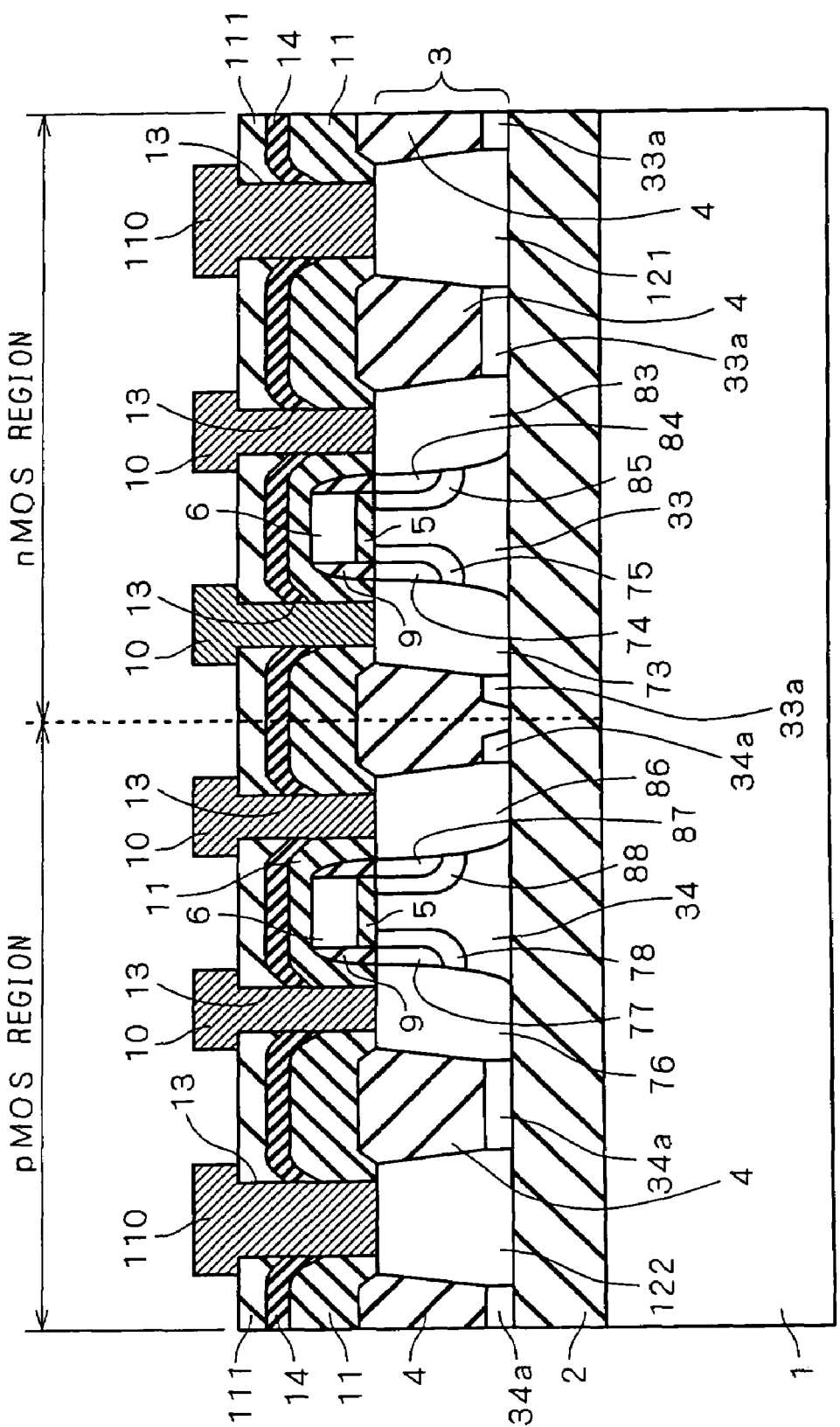

FIGS. 14 and 15 are cross sections each showing a semiconductor device in accordance with the second preferred embodiment of the present invention. FIG. 14 shows a p well 33, an n well 34, n-type source/drain regions 73, 74, 83 and 84, p-type pocket implantation regions 75 and 85, p-type source/drain regions 76, 77, 86 and 87, n-type pocket implantation regions 78 and a p-type impurity region 121 and an n-type impurity region 122. Further, the p well 33 and the n well 34 below the isolation insulating film 4 are particularly represented as 33a and 34a, respectively.

Referring to FIG. 14, in the second preferred embodiment, an nMOS transistor is formed in the p well 33 which is formed by implanting ions into the semiconductor layer and a pMOS transistor is formed in the n well 34, forming a CMOS structure. The nMOS transistor and the pMOS transistor are isolated from each other by a PTI and the channel formation regions of the nMOS transistor and the pMOS transistor are connected to the p-type impurity region 121 and the n-type impurity region 122, respectively, through the semiconductor layer below the PTI and the potentials thereof are fixed. The p well 33 contains an impurity such as B, $BF_2$ or In of about $1 \times 10^{15}$ to $1 \times 10^{19}/cm^3$, and the n well 34 contains an impurity such as P, AS or Sb of about $1 \times 10^{15}$ to $1 \times 10^{19}/cm^3$. When the gate electrode 6 in the nMOS transistor comprises a polysilicon layer, the polysilicon layer contains an n-type impurity such as phosphorus of about 2 to $15 \times 10^{20}/cm^3$, like in the first preferred embodiment, while the impurity contained in the polysilicon of the gate electrode 6 in the pMOS transistor may be a p-type impurity such as boron in some cases (Dual Gate structure) and may be an n-type impurity in other cases (Single Gate structure).

The film thicknesses and impurity concentrations of constituent elements, other than the above, are the same as those in the semiconductor device of the first preferred embodiment.

According to the second preferred embodiment, since the semiconductor device in which the element is formed on the main surface of the SOI substrate consisting of the semiconductor substrate 1, the buried oxide film 2 provided entirely over the surface of the semiconductor substrate 1 and the semiconductor layer 3 provided on the surface of the buried oxide film 2 comprises the silicon nitride film 14 formed on a surface of the element with the interlayer insulating film 11 interposed therebetween, micro-defects which develop into lifetime killers are generated in the semiconductor layer 3a below the isolation insulating film 4 by a stress of the silicon nitride film 14 and this shorten the lifetime of carriers (positive hole in an nMOS and electrons in a pMOS). Therefore, even if the thickness of the semiconductor layer 3 (p well region 33 (the first semiconductor region), n well region 34 (the second semiconductor region)) below the isolation insulating film 4 becomes thinner, a potential of the channel formation region below the gate electrode 6 can be stably fixed and a floating-body effect, such as the frequency dependency of delay time, can be suppressed, whereby the reliability of the semiconductor device can be improved.

Further, in the CMOS structure, if transistors of reverse conductivity types are provided adjacently to each other with the PTI (the isolation insulating film 4 and (the p well 33+the n well 34) (the third semiconductor region)) interposed therebetween, the breakdown voltage between the p well 33 and the n well 34 which are adjacent to each other increases due to micro-defects which are generated in the third semiconductor region below the isolation insulating film 4 and develops into a lifetime killer, whereby the reliability of the semiconductor device can be advantageously improved.

Further, though it is known that the hot carrier resistance is deteriorated if the hydrogen enters the gate insulating film 5 (the buried oxide film 2) and the hydrogen termination occurs at the interface of the semiconductor layer 3 and the gate insulating film 5, since the silicon nitride film 14 is formed in the semiconductor device of this preferred embodiment, it is possible to prevent entry of hydrogen into the gate insulating film 5 and the buried oxide film 2 and this improves the hot carrier resistance.

Furthermore, as shown in FIG. 15, if the nMOS region and the pMOS region are isolated from each other by the FTI which is the isolation insulating film 4 reaching the buried oxide film 2, the latch-up resistance can be improved though the manufacturing process becomes complicated.

Next, discussion will be made on a method of manufacturing the semiconductor device in accordance with the second preferred embodiment of the present invention.

Figure 16:
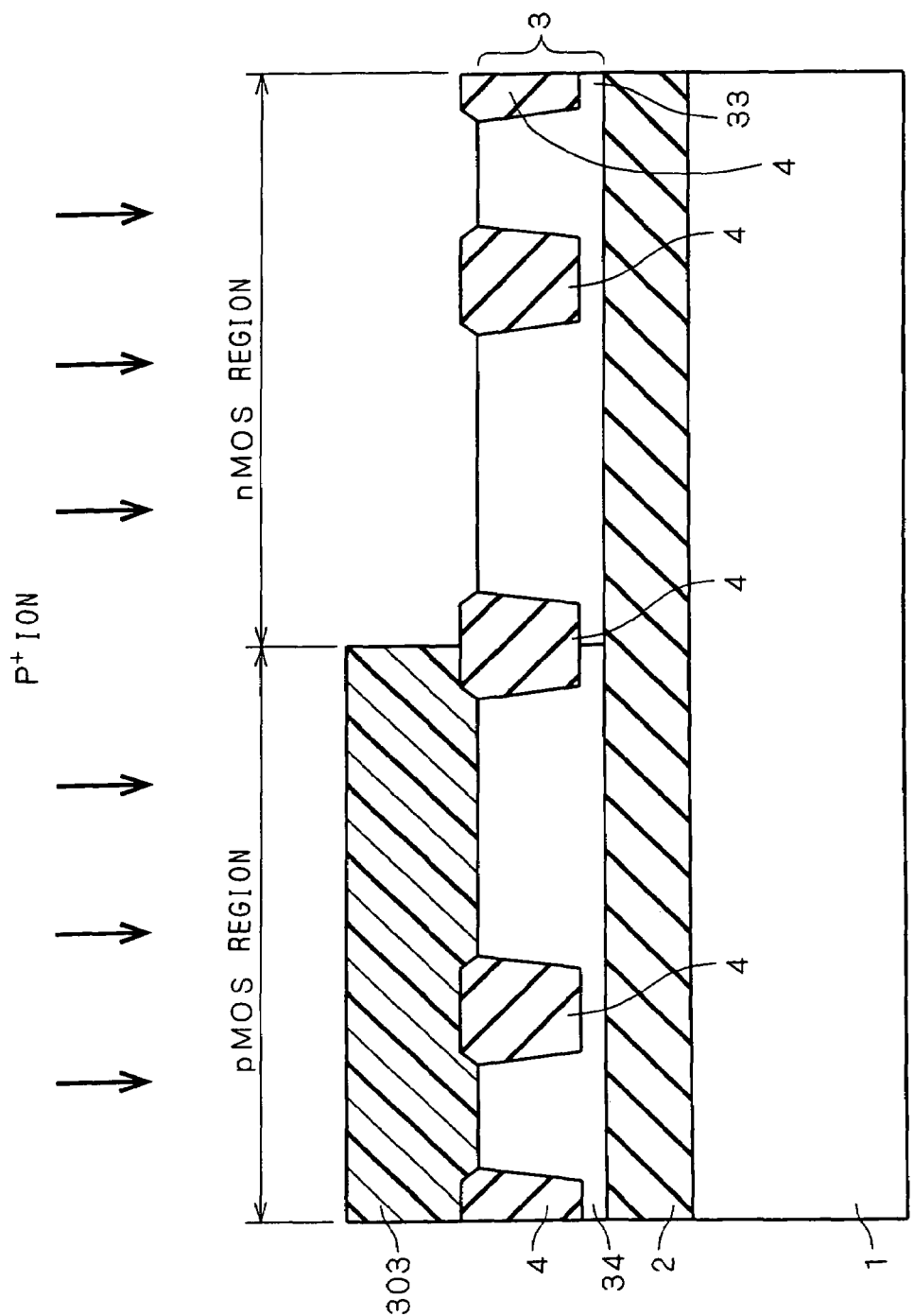
FIG. 16 is a cross section showing a process step in a method of manufacturing a semiconductor device in accordance with the second preferred embodiment of the present invention.

FIG. 16 is a cross section showing a process step in a method of manufacturing a semiconductor device in accordance with the second preferred embodiment of the present invention. FIG. 16 shows a photoresist mask 303.

First, in the same manner as in the first preferred embodiment, the isolation insulating film 4 is formed on the surface of the SOI substrate in which the semiconductor layer 3 is provided on the surface of the semiconductor substrate 1 with the buried oxide film 2 interposed therebetween.

Then, the photoresist mask 303 having an opening for the nMOS region is formed and a p-type impurity such as B, $BF_2$ or In is ion-implanted, to form the p well 33 having an impurity concentration of about $1\times10^{15}$ to $1\times10^{19}/cm^3$. FIG. 16 is the cross section showing the element of the semiconductor device at the end of this step. After that, the photoresist mask 303 is removed.

In the same manner as the p well 33 is formed, a photoresist mask having an opening for the pMOS region is formed and an n-type impurity such as P, As or Sb is entirely ion-implanted, to form the n well 34 having an impurity concentration of about $1\times10^{15}$ to $1\times10^{19}/cm^3$ (not shown). After that, the photoresist mask is removed.

Then, in the same manner as in the first preferred embodiment, the p-type impurity region 121 and the n-type impurity region 122 are formed.

Other than the above ion implantation, in portions where the nMOS region and the p MOS region have different conductivity types, separate ion implantations are performed with photoresist mask having openings for respective regions in the same manner as in the first preferred embodiment.

According to the method of manufacturing the semiconductor device of the second preferred embodiment, since the semiconductor device in which the element is formed on the main surface of the SOI substrate consisting of the semiconductor substrate 1, the buried oxide film 2 provided entirely over the surface of the semiconductor substrate 1 and the semiconductor layer 3 provided on the surface of the buried oxide film 2 comprises the silicon nitride film 14 formed on a surface of the element with the interlayer insulating film 11 interposed therebetween, micro-defects which develop into lifetime killers are generated in the semiconductor layer 3a below the isolation insulating film 4 by a stress of the silicon nitride film 14 and this shorten the lifetime of carriers (positive hole in an nMOS and electrons in a pMOS). Therefore, even if the thickness of the semiconductor layer below the isolation insulating film becomes thinner, a potential of the channel formation region below the gate electrode 6 can be stably fixed and a floating-body effect, such as the frequency dependency of delay time, can be suppressed, whereby the semiconductor device of higher reliability can be manufactured.

Further, in the CMOS structure, if transistors of reverse conductivity types are provided adjacently to each other with the PTI interposed therebetween, since the silicon nitride film 14 is formed in the semiconductor device of this preferred embodiment, the breakdown voltage between the p well 33 and the n well 34 which are adjacent to each other increases due to micro-defects generated in the semiconductor layer below the isolation insulating film, to increase latch-up resistance, whereby the reliability of the semiconductor device can be advantageously improved.

Further, though it is known that the hot carrier resistance is deteriorated if the hydrogen enters the gate insulating film 5 and the hydrogen termination occurs at the interface of the semiconductor layer 3 and the gate insulating film 5, since the silicon nitride film 14 is formed in the semiconductor device of this preferred embodiment, it is possible to prevent entry of hydrogen into the gate insulating film 5 and the buried oxide film 2, whereby the method of manufacturing the semiconductor device of increased hot carrier resistance can be obtained.

Furthermore, since the thick interlayer insulating film 111 on the silicon nitride film 14 and the thin interlayer insulating film 11 below the silicon nitride film 14 are separately etched with the silicon nitride film 14 to form the contact holes, it is possible to prevent overetching of the semiconductor layer by controlling the etching condition of the interlayer insulating film 11 below the silicon nitride film 14, whereby the semiconductor device which has no possibility of generating the junction leak current can be obtained.

The Third Preferred Embodiment

Figure 17:
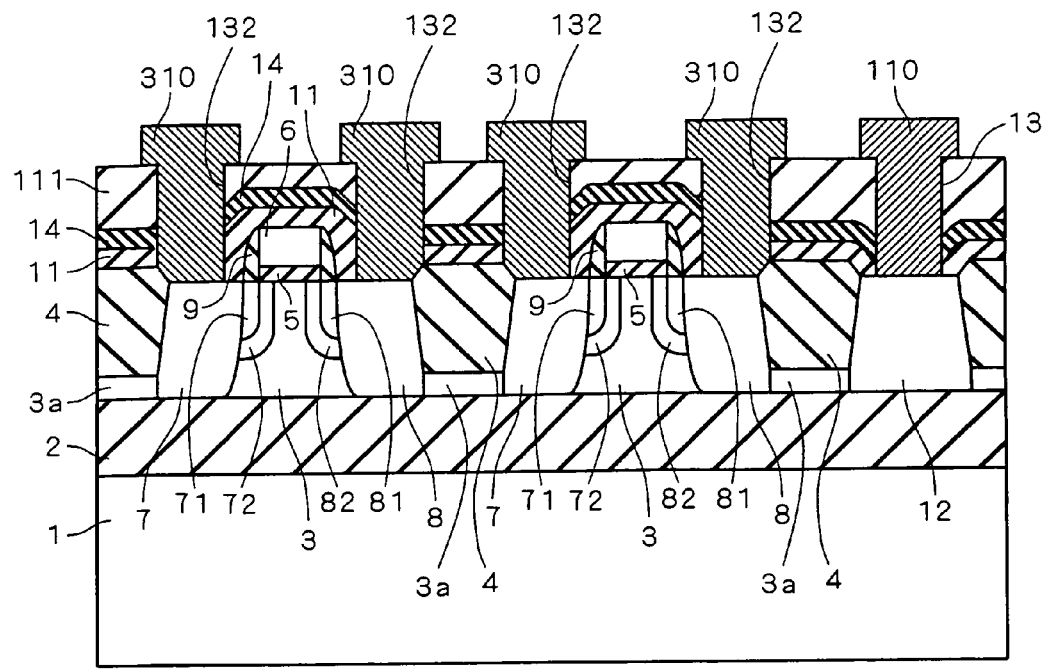
FIG. 17 is a cross section showing a semiconductor device in accordance with a third preferred embodiment of the present invention.

FIG. 17 is a cross section showing a semiconductor device in accordance with the third preferred embodiment of the present invention. FIG. 17 shows contact holes 132 and wires 310.

In the third preferred embodiment, the interlayer insulating films 11 and 111 and the contact holes 132 formed in the silicon nitride film 14 are formed across the surfaces of the source/drain regions 7 and 8 and the isolation insulating film 4, and the wires 310 connected to the source/drain regions 7 and 8 through the contact holes 132 are also formed on the surface of the isolation insulating film 4. Other than this point, the present structure of the third preferred embodiment is the same as that of the first preferred embodiment.

Figure 18:
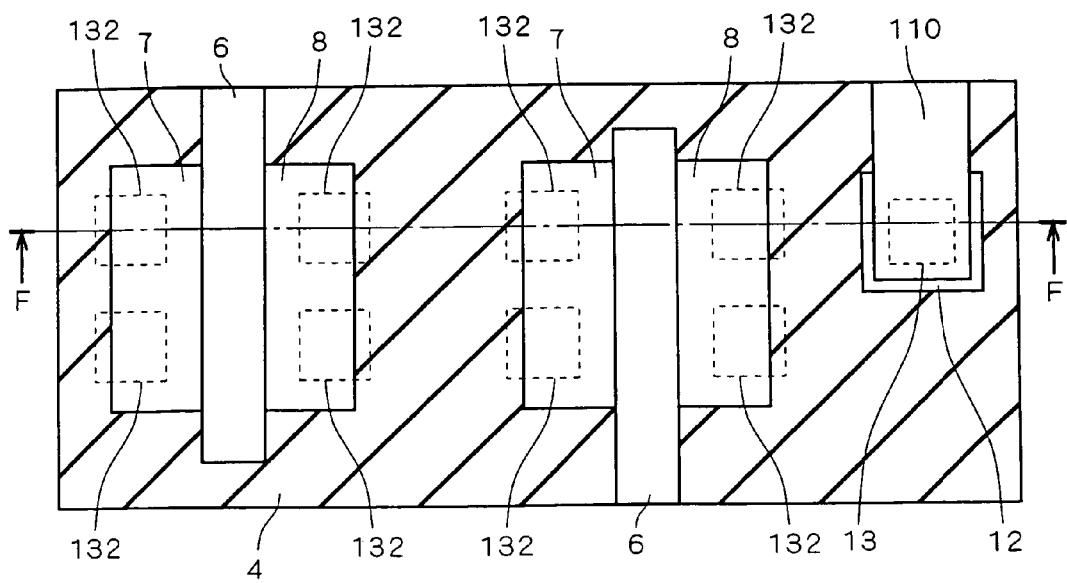
FIG. 18 is a plan view showing the semiconductor device in accordance with the third preferred embodiment of the present invention.

FIG. 18 is a plan view showing the semiconductor device in accordance with the third preferred embodiment of the present invention, and FIG. 17 is the cross section taken along the section F-F of FIG. 18. In FIG. 18, the interlayer insulating films 11 and 111, the silicon nitride film 14, the wires 110 and 310, the sidewall insulating film 9, the source/drain regions 71 and 81 and the pocket implantation regions 72 and 82 are omitted, for convenience of illustration.

Since the semiconductor device of the third preferred embodiment, which has a borderless contact structure in which the wires 310 connected to the source/drain regions 7 and 8 are formed across the adjacent isolation insulating films 4, comprises the silicon nitride film 14, the isolation insulating film 4 is prevented from being etched when the contact holes 132 reaching the source/drain regions 7 and 8 are formed and sufficient distances from the pn junctions between the semiconductor layer 3a and the source/drain regions 7 and 8 to the wires 310 can be ensured, whereby the semiconductor device of higher element density and higher reliability can be obtained.

According to the third preferred embodiment, since the semiconductor device in which the element is formed on the main surface of the SOI substrate consisting of the semiconductor substrate 1, the buried oxide film 2 provided entirely over the surface of the semiconductor substrate 1 and the semiconductor layer 3 provided on the surface of the buried oxide film 2 comprises the silicon nitride film 14 formed on a surface of the element with the interlayer insulating film 11 interposed therebetween, micro-defects which develop into lifetime killers are generated in the semiconductor layer 3a below the isolation insulating film 4 by a stress of the silicon nitride film 14 and this shorten the lifetime of carriers (positive hole in an nMOS and electrons in a pMOS). Therefore, even if the thickness of the semiconductor layer 3a below the isolation insulating film 4 becomes thinner, a potential of the channel formation region below the gate electrode 6 can be stably fixed and a floating-body effect, such as the frequency dependency of delay time, can be suppressed, whereby the reliability of the semiconductor device can be improved.

Further, though it is known that the hot carrier resistance is deteriorated if the hydrogen enters the gate insulating film 5 and the hydrogen termination occurs at the interface of the semiconductor layer 3 and the gate insulating film 5, since the silicon nitride film 14 is formed in the semiconductor device of this preferred embodiment, it is possible to prevent entry of hydrogen into the gate insulating film 5 and the buried oxide film 2 and this improves the hot carrier resistance.

Figure 19:
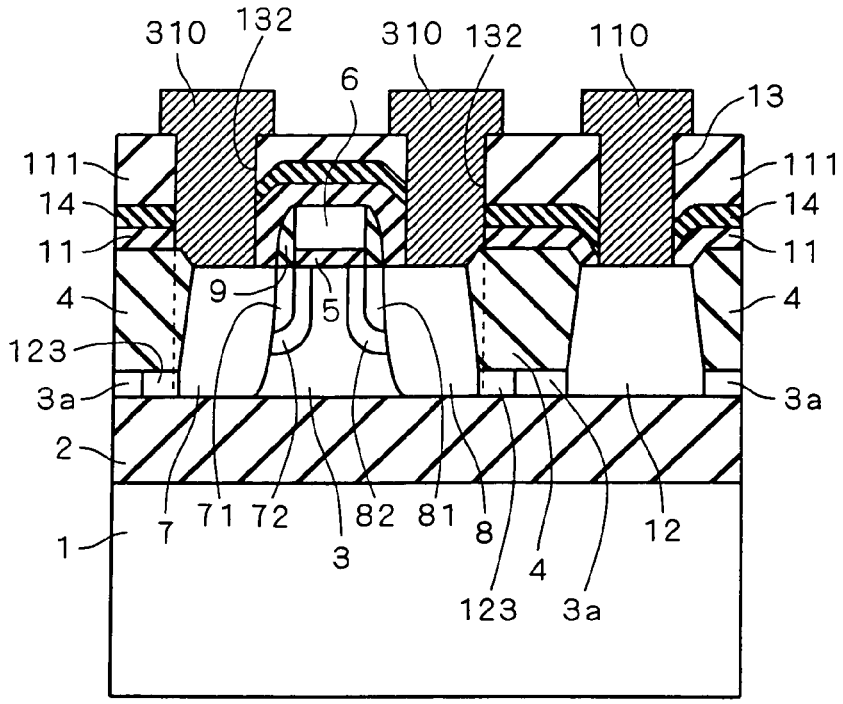
FIG. 19 is a cross section showing the semiconductor device in accordance with the third preferred embodiment of the present invention.

FIG. 19 is a cross section showing another semiconductor device in accordance with the third preferred embodiment of the present invention, showing an n-type partial impurity region 123. Referring to FIG. 19, the n-type impurity region 123 contains an impurity such as P, As or Sb of about $1 \times 10^{15}$ to $1 \times 10^{19}/cm^3$, and is connected to the source/drain region 7 and extends towards the central portion of the isolation insulating film 4 relative to a region where the contact hole 132 is formed on the isolation insulating film 4. The n-type impurity region 123 can be formed by diagonally implanting ions after forming the contact hole 132. Other than this point, the present structure of the third preferred embodiment is the same as that of the semiconductor device of FIG. 17.

In the semiconductor device of borderless contact structure, despite the presence of the silicon nitride film 14, the exposed isolation insulating film 4 is likely to be etched in forming the contact hole 132. In this preferred embodiment, however, with the presence of the n-type impurity region 123, it is possible to ensure sufficient distance between the wire 310 and the p-type semiconductor layer 3 and eliminate the possibility of generating the leak current at a junction between the semiconductor layer 3a and the n-type impurity region 123.

Figure 20:
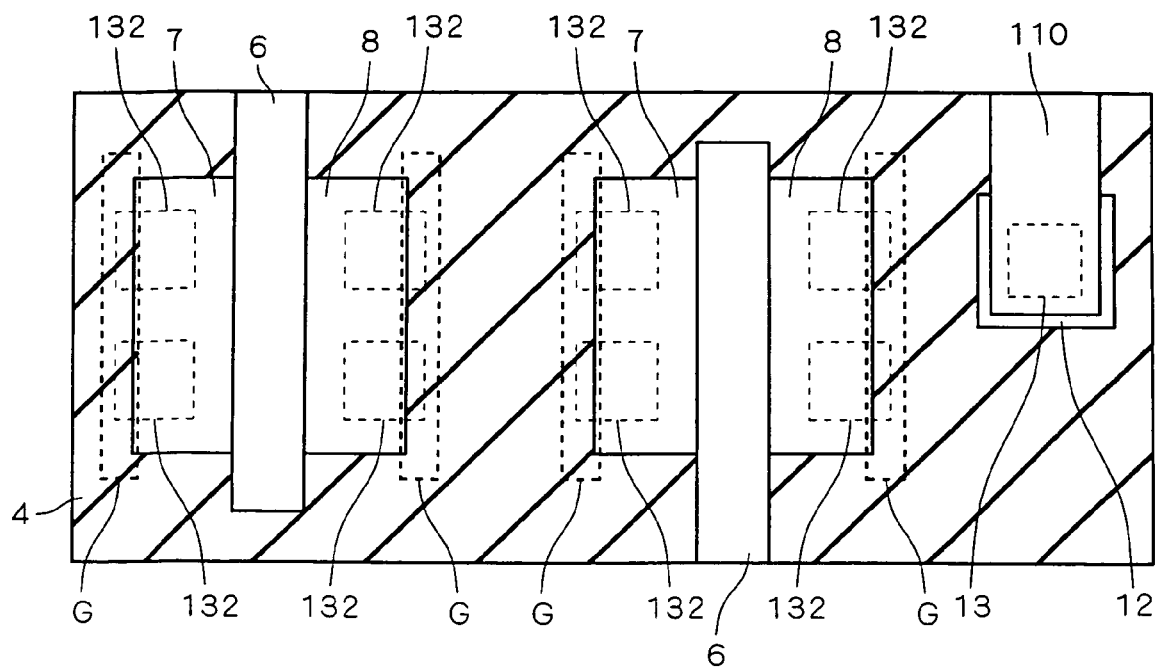
FIG. 20 is a plan view showing the semiconductor device in accordance with the third preferred embodiment of the present invention.

FIG. 20 is a plan view showing still another semiconductor device in accordance with the third preferred embodiment of the present invention. The structure of this semiconductor device is the same as that of the semiconductor device shown in FIG. 17, except that the isolation insulating film 4 is an FTI reaching the buried oxide film 2 in a portion enclosed by the broken line G. According to the semiconductor device shown in FIG. 20, though the function of the lifetime killer is deteriorated as compared with the semiconductor device shown in FIG. 17, there is no possibility that the isolation insulating film 4 should be connected to the semiconductor layer 3a, even if being etched in forming the contact hole 132, whereby the reliability of the semiconductor device is improved.

Though the discussion is made referring to the figure in which the silicon nitride film 14 is entirely formed in the third preferred embodiment, the isolation performance can be improved only if the silicon nitride film 14 is formed in a region in which the PTI is used as device isolation in a semiconductor device in which the PTI and the FTI are used together.

Further, the shape of the isolation insulating film 4 can be kept only if the silicon nitride film 14 is formed on a surface of a portion where the wire 310 is formed across the surfaces of the source/drain regions 7 and 8 and the isolation insulating film 4.

Furthermore, the borderless contact structure can be applied to the semiconductor devices in the first and second preferred embodiments and produce the same effect.

Next, discussion will be made on a method of manufacturing the semiconductor device in accordance with the third preferred embodiment of the present invention.

Figure 21:
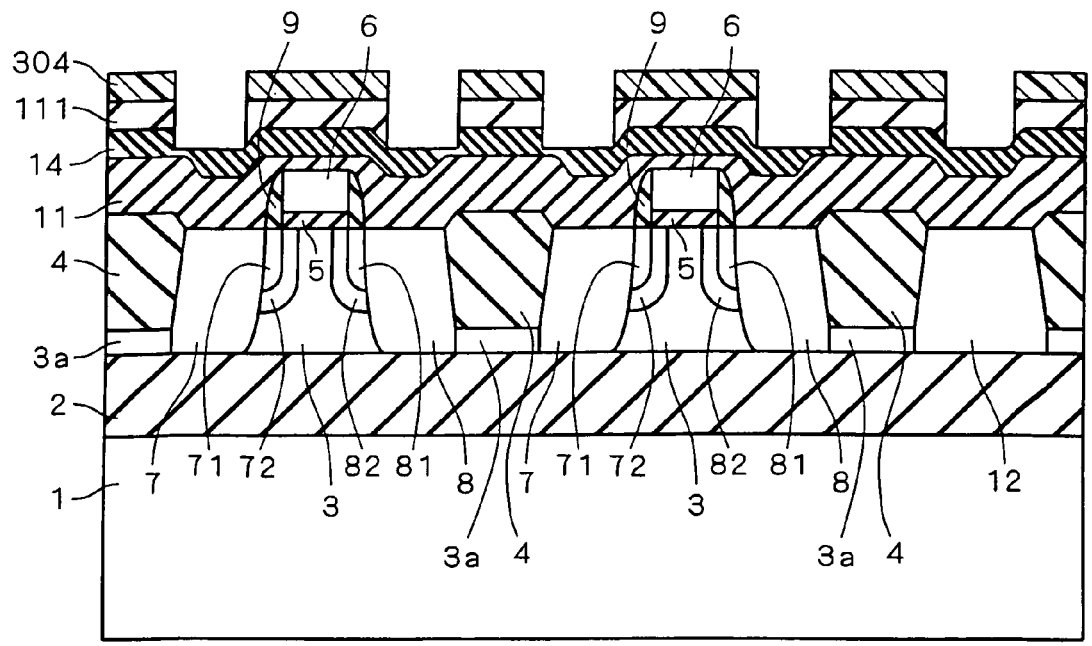
FIG. 21 is a cross section showing a process step in a method of manufacturing a semiconductor device in accordance with the third preferred embodiment of the present invention.
Figure 22:
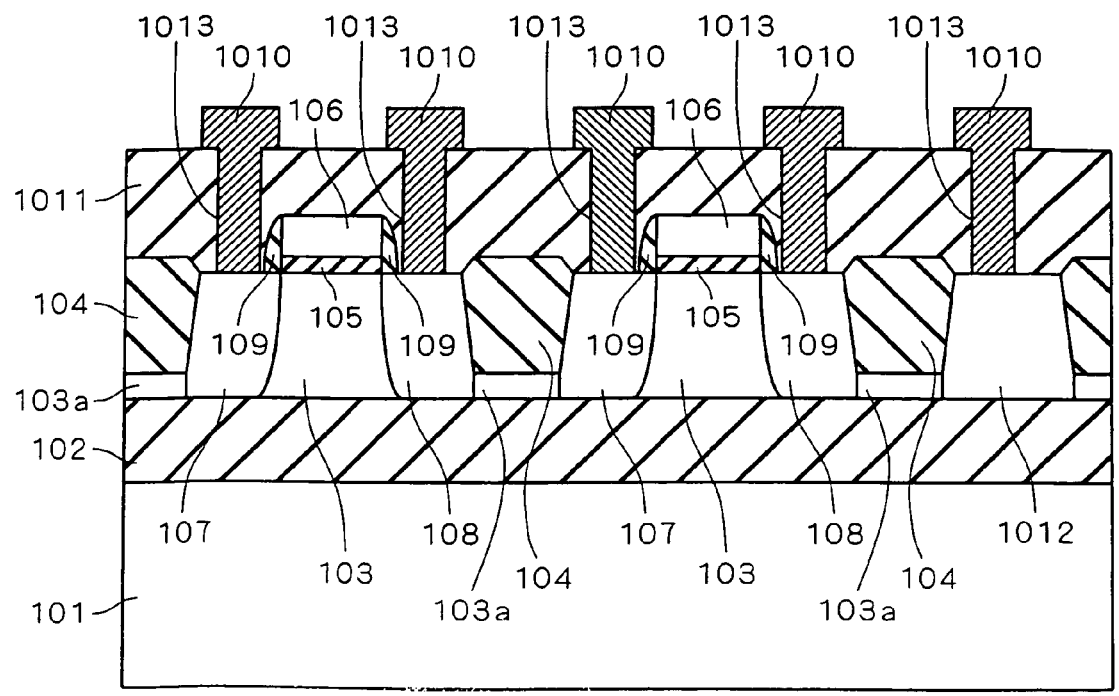
FIGS. 22 to 24 are cross sections each showing a semiconductor device in the background art.
Figure 23:
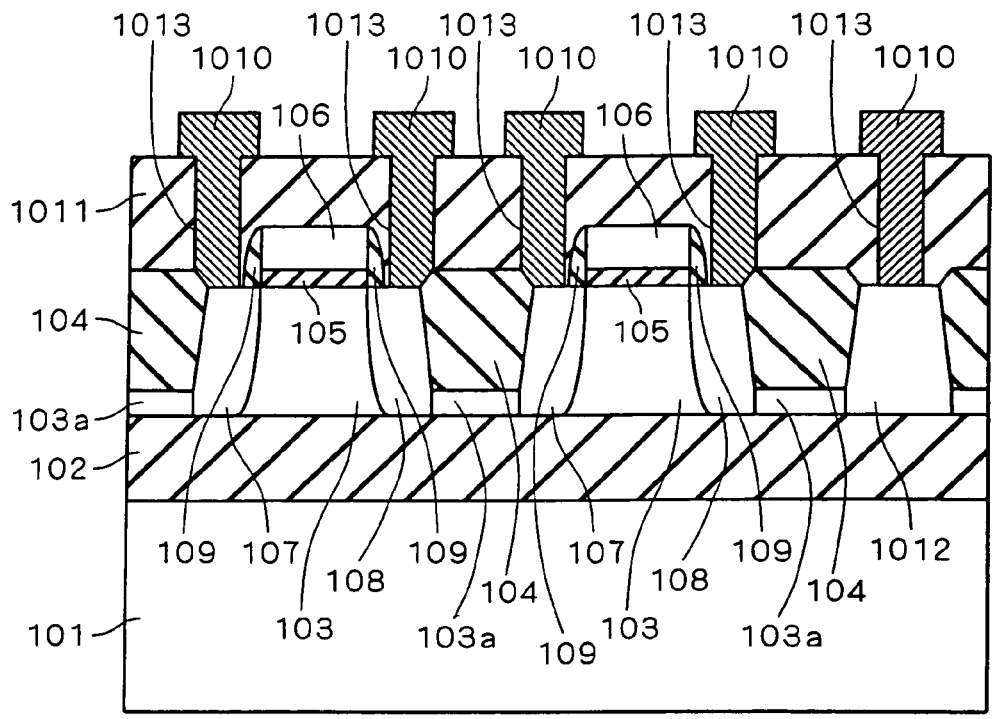
Figure 24:
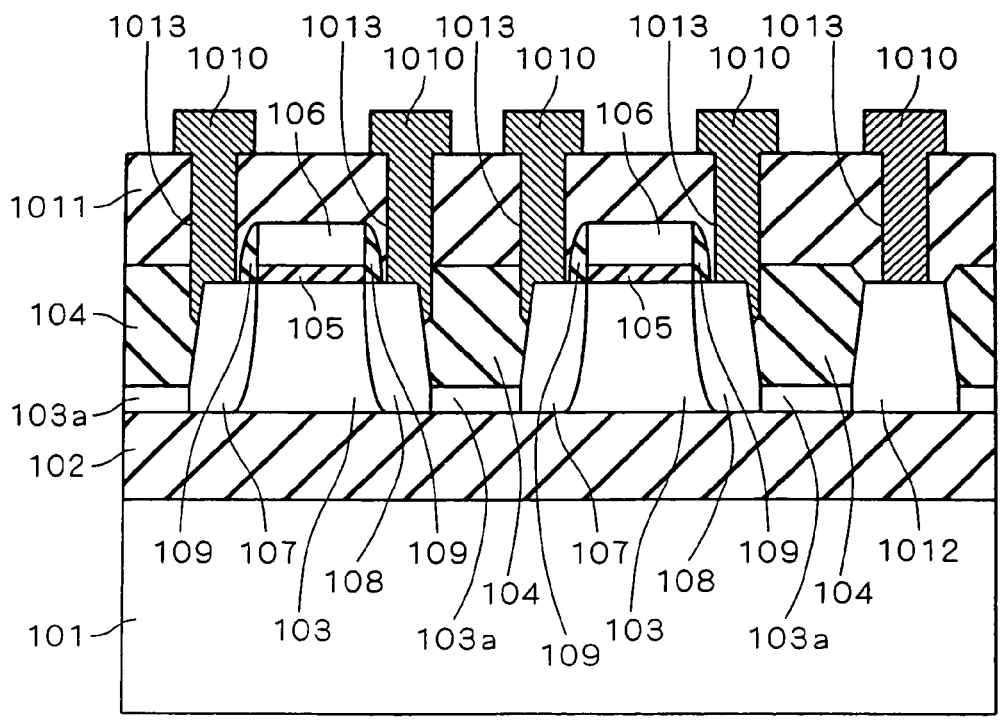

FIG. 21 is a cross section showing a process step in a method of manufacturing a semiconductor device in accordance with the third preferred embodiment of the present invention. FIG. 21 shows a photoresist mask 304.

First, in the same manner as in the first preferred embodiment, the isolation insulating film 4, the p-type impurity region (n-type impurity region in the case of pMOS), the gate insulating film 5, the gate electrode 6, the pocket implantation regions 72 and 82, the source/drain regions 71 and 81, the sidewall insulating film 9 and the source/drain regions 7 and 8 are formed on the surface of the SOI substrate in which the semiconductor layer 3 is formed on the surface of the semiconductor substrate 1 with the buried oxide film 2 interposed therebetween.

Then, the interlayer insulating film 11, the silicon nitride film 14 and the interlayer insulating film 111 are formed in the same manner as in the first preferred embodiment, and these are planarized by the CMP method. After the planarization, to eliminate the raggedness in the surface through the CMP, a silicon oxide film is deposited again to have a thickness of about 50 to 200 nm in the same manner as the interlayer insulating film 11 is formed (not shown).

After forming the photoresist mask 304 having an opening at a region in which the contact holes 13 and 132 to be connected to the source/drain regions 7 and 8 and the p-type impurity region 12 are to be formed on the surface of the interlayer insulating film 111, the interlayer insulating film 111 is etched in the same manner as in the first preferred embodiment. At this time, the photoresist mask 304 is patterned so that the contact hole 132 can be formed not only on the surface of the source/drain regions 7 and 8 but also on the surface of the isolation insulating film 4. FIG. 21 is the cross section showing the element of the semiconductor device at the end of this step.

Next, the remaining silicon nitride film 14 and interlayer insulating film 11 are etched under the condition of lower selection ratio of the silicon nitride film and the silicon oxide film, to form the contact holes 132 and 13.

Then, the wires 110 and 310 are formed in the same manner as in the first preferred embodiment, to form the semiconductor device shown in FIG. 17.

Further, after that, the same steps as in the first preferred embodiment are performed, to form a multilayer interconnection structure (not shown).

According to the method of manufacturing the semiconductor device of the third preferred embodiment, since the thick interlayer insulating film 111 on the silicon nitride film 14 and the thin interlayer insulating film 11 below the silicon nitride film 14 are separately etched with the silicon nitride film 14 to form the contact holes in the semiconductor device having a borderless contact structure in which the wires connected to the source/drain regions are formed across the adjacent isolation insulating films, the overetching of the semiconductor layer can be prevented by controlling the etching condition of the interlayer insulating film below the silicon nitride film 14 and therefore a semiconductor device which has no possibility of generating a junction leak current can be obtained. Further, the isolation insulating film 4 is prevented from being etched when the contact holes 132 reaching the source/drain regions 7 and 8 are formed and sufficient distances from the pn junctions between the semiconductor layer 3a and the source/drain regions 7 and 8 to the wires can be ensured, whereby the semiconductor device of higher element density and higher reliability can be obtained.

According to the method of manufacturing the semiconductor device of the third preferred embodiment, since the semiconductor device in which the element is formed on the main surface of the SOI substrate consisting of the semiconductor substrate 1, the buried oxide film 2 provided entirely over the surface of the semiconductor substrate 1 and the semiconductor layer 3 provided on the surface of the buried oxide film 2 comprises the silicon nitride film 14 formed on a surface of the element with the interlayer insulating film interposed therebetween, micro-defects which develop into lifetime killers are generated in the semiconductor layer 3a below the isolation insulating film 4 by a stress of the silicon nitride film 14 and this shorten the lifetime of carriers (positive hole in an NMOS and electrons in a pMOS). Therefore, even if the thickness of the semiconductor layer 3a below the isolation insulating film 4 becomes thinner, a potential of the channel formation region below the gate electrode 6 can be stably fixed and a floating-body effect, such as the frequency dependency of delay time, can be suppressed, whereby the semiconductor device of higher reliability can be manufactured.

Further, though it is known that the hot carrier resistance is deteriorated if the hydrogen enters the gate insulating film 5 and the hydrogen termination occurs at the interface of the semiconductor layer 3 and the gate insulating film 5, since the silicon nitride film 14 is formed in the semiconductor device of this preferred embodiment, it is possible to prevent entry of hydrogen into the gate insulating film 5 and the buried oxide film 2, whereby the method of manufacturing the semiconductor device of improved hot carrier resistance can be obtained.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device, comprising the steps of:
    (a) preparing an SOI substrate having a semiconductor layer which is formed with a substrate in which at least its surface is insulative disposed therebelow, said semiconductor layer having a first active region and a second active region both of a first conductivity type in a main surface thereof;
    (b) forming an isolation insulating film so as to surround said first and second active regions and leave a first semiconductor region which is part of said semiconductor layer therebelow;
    (c) forming a first interlayer insulting film on said semiconductor layer in said first and second active regions and a surface of said isolation insulating film;
    (d) forming a silicon nitride film on said first interlayer insulating film; and
    (e) forming a second interlayer insulating film on a surface of said silicon nitride film, wherein
    said substrate includes a semiconductor substrate and a buried oxide film, and
    said method further comprising the steps of:
    (f) forming a first impurity region of the first conductivity type on a main surface of said semiconductor layer in said second active region;
    (g) forming a first gate electrode on said main surface of said semiconductor layer in said first active region with a first gate insulating film interposed therebetween;
    (h) forming first source region and drain region of a second conductivity type in said main surfaces of said semiconductor layer of said first active region which sandwich a region opposed to said first gate electrode at a predetermined distance;
    (i) forming contact holes which reach said first source region and drain region and said first impurity region in said first and second interlayer insulating films and said silicon nitride film, respectively; and
    (j) forming a first wire, a second wire, a third wire which are connected to said first source region and drain region and said first impurity region through said contact holes, respectively.

2. The method of manufacturing a semiconductor device according to claim 1, wherein
    said semiconductor layer further has a third active region of the second conductivity type and a fourth active region of the second conductivity type in its main surface, and said fourth source region is provided adjacently to said first active region and said third active region is provided adjacently to said fourth active region,
    said step (a) includes the steps of:
    (a-1) selectively introducing an impurity of the first conductivity type into said main surface of said semiconductor layer to obtain said first and second active regions;
    and
    (a-2) selectively introducing an impurity of the second conductivity type into said main surface of said semiconductor layer to obtain said third and fourth active regions,
    said step (b) includes the step of:
    forming said isolation insulating film so as to surround said third and fourth active regions and leave a second semiconductor region which is part of said semiconductor layer therebelow;
    said step (f) includes the step of:
    forming a second impurity region of the second conductivity type in said third active region,
    said step (g) includes the step of:
    forming a second gate electrode on a main surface of said fourth active region with a second gate insulating film interposed therebetween,
    said step (h) includes the step of:
    forming second source region and drain region of the first conductivity type in said main surfaces of said semiconductor layer of said fourth active region which sandwich a region opposed to said second gate electrode at a predetermined distance,
    said first interlayer insulating film, said silicon nitride film and said second interlayer insulating film formed in said steps (c) to (e) extend onto surfaces of said semiconductor layer in said third and fourth active regions,
    said step (i) includes the step of:
    forming contact holes which reach said second source region and drain region and said second impurity region in said first and second interlayer insulating films and said silicon nitride film, respectively, and
    said step (j) includes the step of:

forming a fourth wire, a fifth wire, a sixth wire which are connected to said second source region and drain region and said second impurity region through said contact holes, respectively.

3. A method of manufacturing a semiconductor device, comprising the steps of:
   (a) preparing an SOI substrate having a semiconductor layer which is formed with a substrate in which at least its surface is insulative disposed therebelow, said semiconductor layer having a first active region and a second active region both of a first conductivity type in a main surface thereof;
   (b) forming an isolation insulating film so as to surround said first and second active regions and leave a first semiconductor region which is part of said semiconductor layer therebelow;
   (c) forming a first interlayer insulting film on said semiconductor layer in said first and second active regions and a surface of said isolation insulating film;
   (d) forming a silicon nitride film on said first interlayer insulating film; and
   (e) forming a second interlayer insulating film on a surface of said silicon nitride film,
wherein
   said substrate includes a semiconductor substrate and a buried oxide film,
   said method further comprising the steps of:
   (f) forming a first impurity region of the first conductivity type on a main surface of said semiconductor layer in said second active region;
   (g) forming a first gate electrode on said main surface of said semiconductor layer in said first active region with a first gate insulating film interposed therebetween;
   (h) forming first source region and drain region of a second conductivity type in said main surfaces of said semiconductor layer of said first active region which sandwich a region opposed to said first gate electrode at a predetermined distance;
   (i) forming contact holes which reach said first source region and drain region and said first impurity region in said first and second interlayer insulating films and said silicon nitride film, respectively; and
   (j) forming a first wire, a second wire, a third wire which are connected to said first source region and drain region and said first impurity region through said contact holes, respectively, and wherein
   said step (i) includes the steps of:
   (i-1) etching said second interlayer insulating film; and
   (i-2) etching said first interlayer insulating film independently of said step (i-1).

4. The method of manufacturing a semiconductor device according to claim 3, wherein
   said contact holes formed in said step (i) include contact holes which extend onto surfaces of said isolation insulating films adjacently to said first source region and drain region, respectively.

5. The method of manufacturing a semiconductor device according to claim 3, wherein
   said step (i-1) includes the step of:
   etching said second interlayer insulating film by a first substance having a predetermined selection ratio to said silicon nitride film; and
   said step (i-2) includes the step of:
   etching said first interlayer insulating film by a second substance having a selection ratio to said silicon nitride film which is smaller than that of said first substance.

6. A method of manufacturing a semiconductor device, comprising the steps of:
   (a) preparing an SOI substrate having a semiconductor layer which is formed with a substrate in which at least its surface is insulative disposed therebelow, said semiconductor layer having a first active region and a second active region both of a first conductivity type in a main surface thereof;
   (b) forming an isolation insulating film so as to surround said first and second active regions and leave a first semiconductor region which is part of said semiconductor layer therebelow;
   (e) forming a silicon nitride film above said semiconductor layer in said first and second active regions and a surface of said isolation insulating film; and
   (d) forming an interlayer insulating film on a surface of said silicon nitride film, wherein
   said substrate includes a semiconductor substrate and a buried oxide film,
   said method further comprising the steps of:
   (e) forming a first impurity region of the first conductivity type on a main surface of said semiconductor layer in said second active region;
   (f) forming a first gate electrode on said main surface of said semiconductor layer in said first active region with a first gate insulating film interposed therebetween;
   (g) forming first source region and drain region of a second conductivity type in said main surfaces of said semiconductor layer of said first active region which sandwich a region opposed to said first gate electrode at a predetermined distance;
   (h) forming contact holes which reach said first source region and drain region and said first impurity region in said interlayer insulating films and said silicon nitride film, respectively; and
   (i) forming a first wire, a second wire, a third wire which are connected to said first source region and drain region and said first impurity region through said contact holes, respectively.

7. The method of manufacturing a semiconductor device according to claim 6, wherein
   said semiconductor layer further has a third active region of the second conductivity type and a fourth active region of the second conductivity type in its main surface, and said fourth source region is provided adjacently to said first active region and said third active region is provided adjacently to said fourth active region,
   said step (a) includes the steps of:
   (a-1) selectively introducing an impurity of the first conductivity type into said main surface of said semiconductor layer to obtain said first and second active regions;
   and
   (a-2) selectively introducing an impurity of the second conductivity type into said main surface of said semiconductor layer to obtain said third and fourth active regions,
   said step (b) includes the step of:
   forming said isolation insulating film so as to surround said third and fourth active regions and leave a second semiconductor region which is part of said semiconductor layer therebelow;
   said step (e) includes the step of:
   forming a second impurity region of the second conductivity type in said third active region,
   said step (f) includes the step of:

forming a second gate electrode on a main surface of said fourth active region with a second gate insulating film interposed therebetween, said step (g) includes the step of:

forming a second source region and drain region of the first conductivity type in said main surfaces of said semiconductor layer of said fourth active region which sandwich a region opposed to said second gate electrode at a predetermined distance, said silicon nitride film and said interlayer insulating film formed in said steps (c) to (d) extend onto surfaces of said semiconductor layer in said third and fourth active regions, said step (h) includes the step of:

forming contact holes which reach said second source region and drain region and said second impurity region in said interlayer insulating films and said silicon nitride film, respectively, and said step (i) includes the step of:

forming a fourth wire, a fifth wire, a sixth wire which are connected to said second source region and drain region and said second impurity region through said contact holes, respectively.

8. The method of manufacturing a semiconductor device according to claim 7, wherein said contact holes formed in said step (h) include contact holes which extend onto surfaces of said isolation insulating films adjacently to said first source region and drain region, respectively.

9. A semiconductor device comprising:

an SOI substrate including a substrate having an insulative surface and a semiconductor layer provided on said surface of said substrate, said semiconductor layer having a first active region of a first conductivity type and a second active region of the first conductivity type both of which are provided in a main surface thereof;

an isolation insulating film formed between said first and second active regions in said main surface of said semiconductor layer, leaving a first semiconductor region which is part of said semiconductor layer between the isolation insulating film and said surface of said substrate;

a first oxide film formed on said first and second active regions;

a silicon nitride film formed on all upper surfaces of said first oxide film and a surface of said isolation insulating film;

a second oxide film formed on a surface of said silicon nitride film; and at least one wire formed on said second oxide film, wherein said substrate includes a semiconductor substrate and a buried insulating film entirely provided on a main surface of said semiconductor substrate, said semiconductor device further comprising:

first source region and drain region of a second conductivity type formed in said main surface of said semiconductor layer of said first active region separated from each other;

a first gate electrode formed on said main surface of said semiconductor layer with a first gate insulating film interposed therebetween as to oppose a region sandwiched between said first source region and drain region;

a first impurity region of the first conductivity type formed in said second active region, being electrically connected to said region sandwiched between said first source region and drain region through said first semiconductor region below said isolation insulating film; and a first wire, a second wire and a third wire connected to said first source region and drain region and said first impurity region through contact holes which are formed as to penetrate said first and second oxide films and said silicon nitride film, respectively;

wherein said first and second wires connected to said source region and drain region include wires extending so as to contact said surfaces of said isolation insulating films adjacent to said first source region and drain region respectively.

\* \* \* \* \*